US010197619B2

(12) United States Patent
Kawanaka et al.

(10) Patent No.: US 10,197,619 B2
(45) Date of Patent: Feb. 5, 2019

(54) STATE DETERMINATION APPARATUS

(71) Applicant: FUJITSU TEN LIMITED, Kobe-shi, Hyogo (JP)

(72) Inventors: Shota Kawanaka, Kobe (JP); Sho Tamura, Kobe (JP)

(73) Assignee: FUJITSU TEN Limited, Kobe (JP)

( * ) Notice: Subject to any disclaimer, the term of this patent is extended or adjusted under 35 U.S.C. 154(b) by 0 days.

(21) Appl. No.: 15/346,156

(22) Filed: Nov. 8, 2016

(65) Prior Publication Data

US 2017/0160334 A1  Jun. 8, 2017

(30) Foreign Application Priority Data

Dec. 2, 2015  (JP) ................................. 2015-235793

(51) Int. Cl.
| | | |
|---|---|---|
| *G01R 31/26* | (2014.01) | |
| *B60L 11/18* | (2006.01) | |
| *G01R 31/327* | (2006.01) | |
| *G01R 31/36* | (2006.01) | |
| *G01R 31/00* | (2006.01) | |

(52) U.S. Cl.
CPC ...... *G01R 31/2607* (2013.01); *B60L 11/1809* (2013.01); *B60L 11/1861* (2013.01); *G01R 31/3277* (2013.01); *G01R 31/3658* (2013.01); *B60L 11/1803* (2013.01); *G01R 31/007* (2013.01)

(58) Field of Classification Search
None
See application file for complete search history.

(56) References Cited

U.S. PATENT DOCUMENTS

| | | | |
|---|---|---|---|
| 2012/0153966 A1* | 6/2012 | Kawamura | G01R 31/028 324/548 |
| 2015/0260799 A1* | 9/2015 | Kuroda | G01R 31/3606 324/434 |
| 2017/0059658 A1* | 3/2017 | Tanaka | G01R 31/3278 |

FOREIGN PATENT DOCUMENTS

| | | |
|---|---|---|
| JP | 2006-337130 A | 12/2006 |
| JP | 2009-103546 A | 5/2009 |
| JP | 2009-192302 A | 8/2009 |
| JP | 2012-088106 A | 5/2012 |
| JP | 2015-214264 A | 12/2015 |

* cited by examiner

*Primary Examiner* — Jermele M Hollington
*Assistant Examiner* — Douglas X Rodriguez
(74) *Attorney, Agent, or Firm* — Oliff PLC

(57) ABSTRACT

A power supply monitoring apparatus includes: a plurality of power supplies that are connected in series; and a capacitor that is connected to each of positive and negative electrodes of the plurality of power supplies via a plurality of switch elements. The power supply monitoring apparatus determines states of the plurality of switch elements, using a voltage value of the capacitor that is acquired when a first switch element of the plurality of switch elements is turned on, the first switch element being connected to one of a total negative-electrode side and a total positive-electrode side of the plurality of power supplies.

13 Claims, 19 Drawing Sheets

STATE DETERMINATION APPARATUS

BACKGROUND OF THE INVENTION

Field of the Invention

The invention relates to a technology that determines a state of a switch element.

Description of the Background Art

Conventionally, a vehicle, such as a hybrid vehicle and an electrical vehicle, includes a power supply that supplies power to a motor that is a power source. Moreover, a monitoring apparatus that employs a DC voltage application method is known as a monitoring apparatus that monitors a state of the power supply.

The foregoing power supply is configured to be insulated from a vehicle body. Therefore, the monitoring apparatus includes a function of monitoring the insulated state of the power supply, i.e., a function of detecting deterioration of an insulation resistor of the power supply. For example, in the monitoring apparatus, a high pressure battery mounted in the vehicle, a ground of the vehicle body and an insulation resistor for the vehicle are connected in series, and a flying capacitor insulated from the high pressure battery is charged. Then, the monitoring apparatus detects the deterioration of the insulation resistor of the power supply based on a voltage of the charged flying capacitor.

Moreover, since the high pressure battery is configured by a plurality of power supply stacks, the monitoring apparatus includes a monitoring function of monitoring the power supply stacks to prevent overcharge of the power supply stacks and also includes a function of monitoring the monitoring function. The monitoring apparatus monitors the overcharge of each of the power supply stacks by the double monitoring functions, based on the voltage of the flying capacitor connected in series to the power supply stacks.

In these days, a technology has been known that detects a failure of a switch based on a potential difference between output terminals measured when a time period in which a pair of switches configuring an nth pair of series circuits is on is overlapped with a time period in which a pair of switches that are turned on next (refer to, for example, Japanese patent application laid-open publication No. 2009-103546).

However, the foregoing technology connects the power supply stack to an output terminal by overlapping on time periods of the pairs of switches. Therefore, a large voltage is sometimes applied to an output side depending on a voltage of the power supply stack, which may damage an element connected to an output terminal. Thus, it cannot be said that the foregoing technology is not very reliable. Thus, the technology is not a recommended method.

SUMMARY OF THE INVENTION

According to one aspect of the invention, a state determination apparatus includes: a plurality of power supplies that are connected in series; a capacitor that is connected to each of positive and negative electrodes of the plurality of power supplies via a plurality of switch elements; and a microcomputer that determines states of the plurality of switch elements, using a voltage value of the capacitor that is acquired when a first switch element of the plurality of switch elements is turned on, the first switch element being connected to one of a total negative-electrode side and a total positive-electrode side of the plurality of power supplies.

Thus, a failure of the switch element can be determined.

According to another aspect of the invention, the microcomputer determines whether a second switch element is in an ON position stuck state in which the second switch element cannot be turned off, by comparing the voltage value of the capacitor to a plurality of threshold values, the second switch element being among the plurality of switch elements.

It is possible to determine whether the switch element is in the ON position stuck state by comparing the voltage value of the capacitor to the plurality of threshold values.

According to another aspect of the invention, each of the plurality of threshold values is set based on a voltage value of one of the plurality of the power supplies or on a total voltage value of the plurality of the power supplies.

Therefore, an object of this invention is to determine a failure of a switch element.

These and other objects, features, aspects and advantages of the invention will become more apparent from the following detailed description of the invention when taken in conjunction with the accompanying drawings.

BRIEF DESCRIPTION OF THE DRAWINGS

FIG. 10 illustrates a charging circuit when a fourth switch is turned on;

FIG. 11 illustrates a charging circuit when a first switch is turned on;

DESCRIPTION OF THE EMBODIMENTS

An embodiment of a state determination apparatus and a state determination method disclosed in this application will be hereinafter described in detail based on the drawings. However, the invention is not limited to this embodiment.

Embodiment 1

<1. Configuration of Charging and Discharging System>

Figure 1:
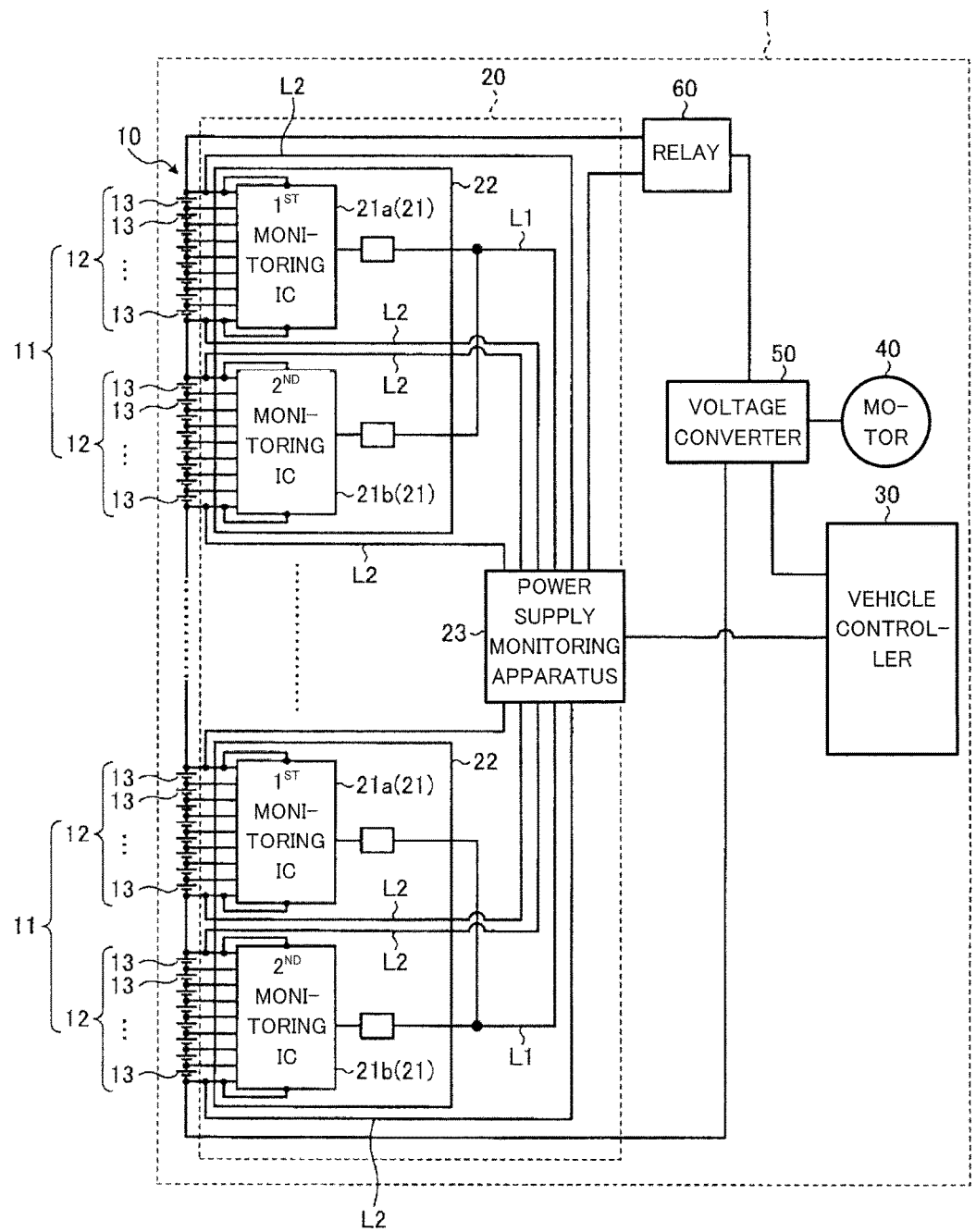
FIG. 1 is a block diagram illustrating a configuration example of a charging and discharging system including a power supply monitoring apparatus of this embodiment.

FIG. 1 is a block diagram illustrating a configuration example of a charging and discharging system including a power supply monitoring apparatus of this embodiment. A charging and discharging system 1 is mounted on, for example, a hybrid electric vehicle (HEV), an electric vehicle (EV) and a fuel cell vehicle (FCV), not illustrated. The charging and discharging system 1 charges and discharges power to/from a power supply that supplies power to a motor. The motor is a power source of the vehicle.

Concretely, the charging and discharging system 1 includes an assembled battery 10, a power supply monitoring system 20, a vehicle controller 30, a motor 40, a voltage converter 50 and a failsafe relay 60. Moreover, the power supply monitoring system 20 includes a power supply monitoring apparatus 23 and a plurality of satellite substrates 22 having a monitoring integrated circuit (IC) 21 and the like.

The assembled battery 10 is a power supply (battery) insulated from a vehicle body (not illustrated) and is configured with a plurality of blocks 11. Each of the plurality of blocks 11 includes a plurality of, for example, two cell stacks 12 connected in series. Moreover, each of the cell stacks 12 includes, for example, a plurality of power cells 13 connected in series.

Numbers of the blocks 11, the cell stacks 12 and the power cells 13 are not limited to the aforementioned or to those illustrated in the drawings. Moreover, a lithium ion secondary battery, a nickel hydride secondary battery and the like can be used as the assembled battery 10. However, the assembled battery 10 is not limited to the foregoing batteries.

The plurality of power cells 13 are electrically connected to the monitoring ICs 21 provided to the plurality of satellite substrates 22. Then, a voltage of each of the plurality of power cells 13 is detected by the monitoring IC 21. The monitoring IC 21 includes a first monitoring IC 21a and a second monitoring IC 21b. Each of the first and second monitoring ICs 21a and 21b detects a total voltage of the plurality of power cells 13 included in one cell stack 12.

While monitoring the voltage of each of the plurality of power cells 13, the power supply monitoring apparatus 23 monitors a voltage of each of the plurality of cell stacks 12. In other words, the power supply monitoring apparatus 23 monitors a charged state of the assembled battery 10.

More specifically, the power supply monitoring apparatus 23 sends a voltage detection command to the monitoring IC 21 to cause the monitoring IC 21 to detect the voltage of each of the plurality of power cells 13 and receives a detection result via a communication line L1 so as to monitor the voltages of the plurality of power cells 13. Moreover, the power supply monitoring apparatus 23 charges a capacitor, described later, at the voltage of the cell stack 12 (also hereinafter referred to as "stack voltage") via a communication line L2 so as to directly measure the stack voltage and to monitor the charged state of the assembled battery 10.

It is recommended that the power supply monitoring apparatus 23 should have a function of determining whether or not the monitoring IC 21 is working properly. More specifically, for example, the power supply monitoring apparatus 23 compares the stack voltage obtained by adding voltages of the plurality of power cells 13 received from the monitoring IC 21 to the stack voltage directly detected. In a case where a difference between those stack voltages is greater than an acceptable value, the power supply monitoring apparatus 23 determines that the monitoring IC 21 has a problem. In a case where the monitoring IC 21 has a problem, for example, the power supply monitoring apparatus 23 may disconnect the failsafe relay 60 not to charge or discharge the plurality of power cells 13.

Moreover, the power supply monitoring apparatus 23 detects deterioration of the insulation resistor (described later) included in the power supply monitoring system 20, which will be described later. Here the deterioration of the insulation resistor means that, for example, the insulation resistance value is reduced and thus electricity leaks from the assembled battery 10.

The vehicle controller 30 controls the vehicle by charging and discharging the assembled battery 10 based on a charged state of the assembled battery 10. More specifically, the vehicle controller 30 converts voltage of the current charged to the assembled battery 10 from a direct current voltage to an alternating current voltage, using the voltage converter 50, so as to supply the current at the converted voltage to the motor 40 to drive the motor 40. Thus, the assembled battery 10 is discharged.

Moreover, the vehicle controller 30 controls the voltage converter 50 to convert a voltage of electricity generated by regenerative braking of the motor 40 from an alternating current voltage to a direct current voltage and then supplies the electricity to the assembled battery 10. Thus, the assembled battery 10 is charged. As described above, the vehicle controller 30 monitors the voltage of the assembled battery 10 based on the charged state of the assembled battery 10 acquired from the power supply monitoring apparatus 23, and performs control appropriate to the monitored result.

<2. Configuration of Power Monitoring System>

Figure 2:
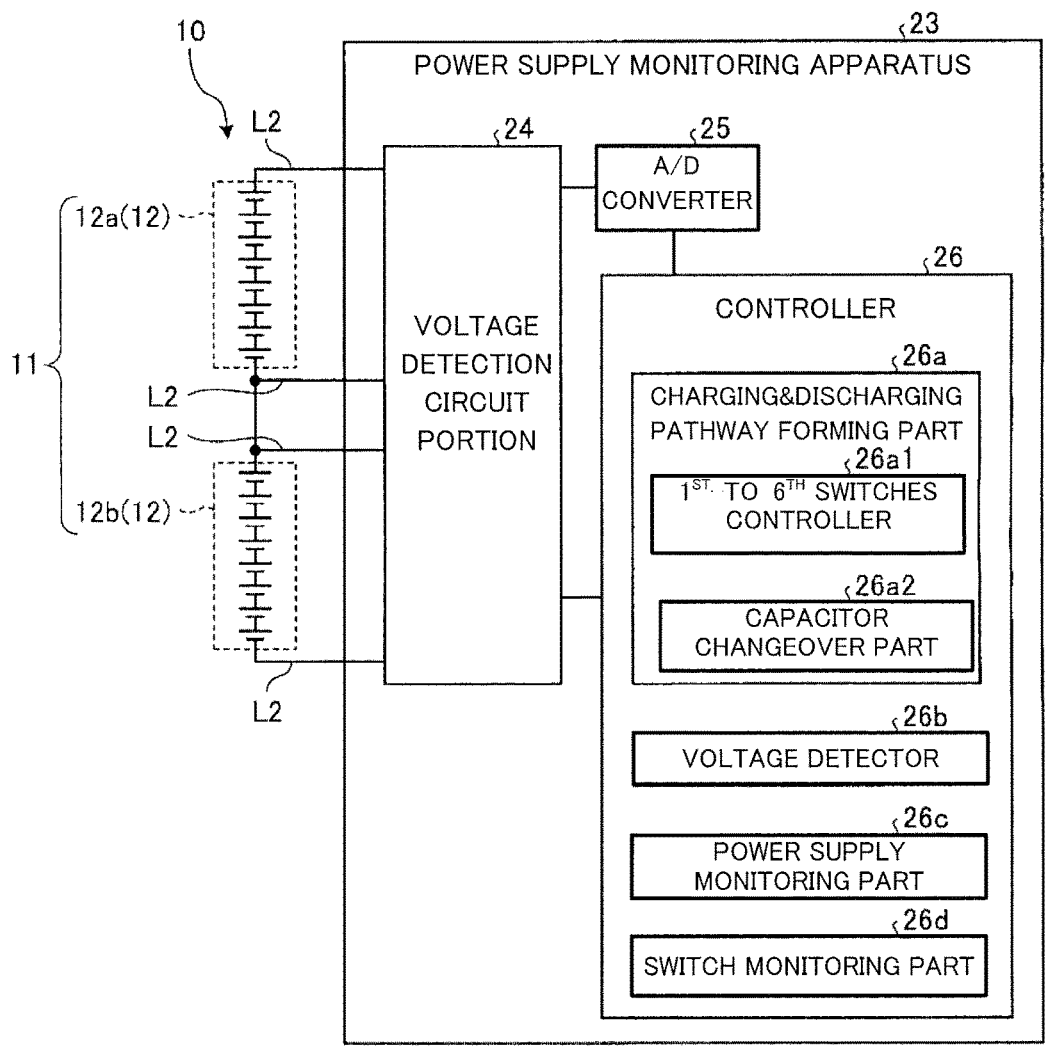
FIG. 2 is a block diagram illustrating a configuration example of the power supply monitoring apparatus.

Next, a configuration of the power supply monitoring apparatus 23 will be described. FIG. 2 is a block diagram illustrating a configuration example of the power supply monitoring apparatus 23. In FIG. 2, the plurality of satellite substrates 22, the communication line L1 and the like are not illustrated. Moreover, for easier understanding, FIG. 2 illustrates one of the plurality of blocks 11, and one of the two cell stacks 12 of the plurality of blocks 11 will be sometimes referred to as a "first stack 12a" and the other will be referred to as a "second stack 12b" below.

The power supply monitoring apparatus 23 is, for example, an electronic control unit (ECU). As illustrated in FIG. 2, the power supply monitoring apparatus 23 includes a voltage detection circuit portion 24, an A/D converter 25 and a controller 26. The voltage detection circuit portion 24 includes a circuit that detects the stack voltage, deterioration of the insulation resistor, etc.

Here, for example, in a case where the voltage detection circuit portion 24 has a circuit that detects each stack voltage and a circuit that detects the deterioration of the insulation resistor, separately, a configuration of the power supply monitoring apparatus 23 will be complicated and there may be a possibility of a cost increase.

Therefore, the cost increase can be prevented by simplifying the configuration of the power supply monitoring apparatus 23 of this embodiment. At the same time, the power supply monitoring apparatus 23 is configured to detect each stack voltage and deterioration of the insulation resistors. The configuration of the power supply monitoring apparatus 23 will be described more in detail below.

Figure 3:
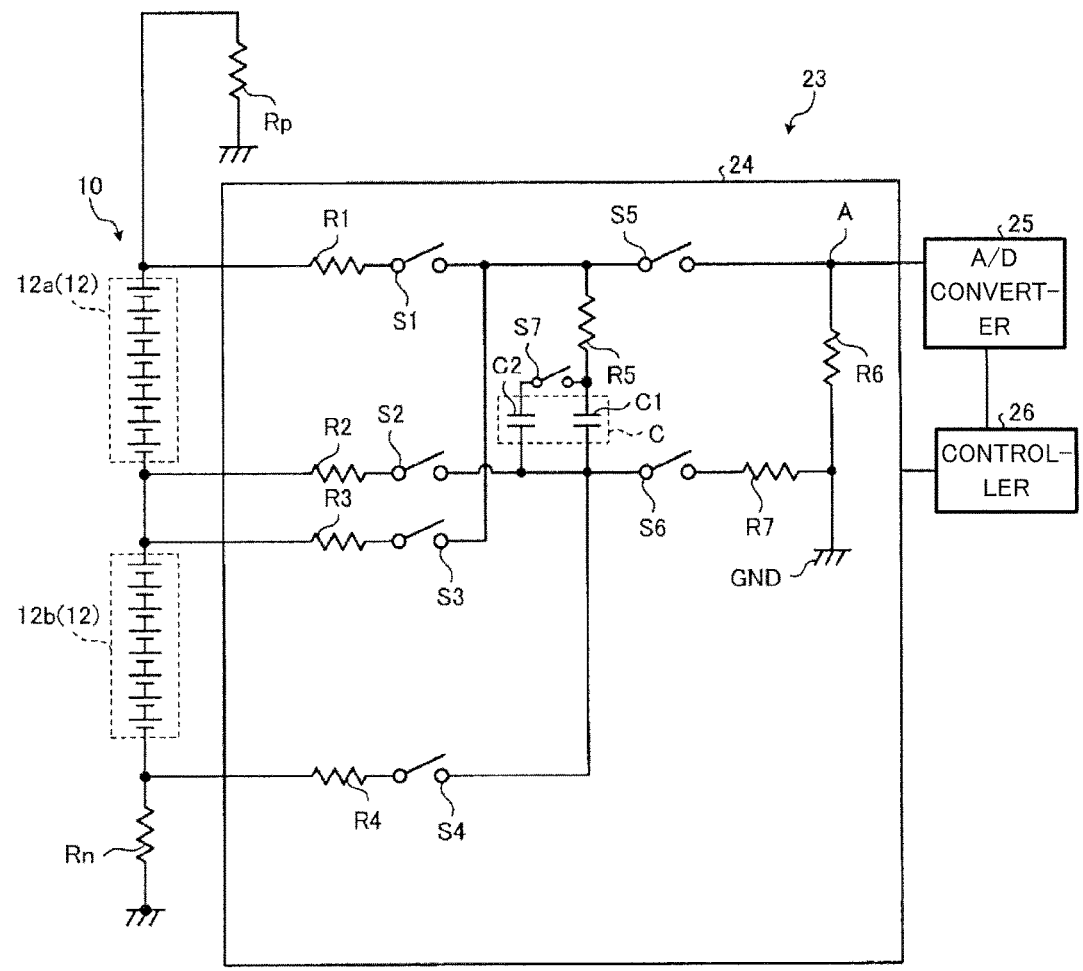
FIG. 3 illustrates a configuration example of a voltage detection circuit portion.

FIG. 3 illustrates a configuration example of the voltage detection circuit portion 24 of the power supply monitoring apparatus 23. As shown in FIG. 3, the voltage detection circuit portion 24 includes a first capacitor C1, a second capacitor C2, a first switch S1 to a sixth switch S6, a changeover switch S7, and a first resistor R1 to a seventh resistor R7. Moreover, the assembled battery 10 includes an insulation resistor Rp on a positive side (positive electrode side) and an insulation resistor Rn on a negative side (negative electrode side).

The voltage detection circuit portion 24 employs a flying capacitor method. As described later, after the first capacitor C1 is charged, using a voltage of each of the stacks 12a and 12b, a voltage of the first capacitor C1 is detected as a voltage of each of the stacks 12a and 12b.

More specifically, the voltage detection circuit portion 24 is divided into a charging side and a discharging side by the first and second capacitors C1 and C2. The first and second capacitors C1 and C2 are sometimes referred to collectively as "capacitor C" below.

A circuit on the charging side includes a pathway in which each of the stacks 12a and 12b of the assembled battery 10 is connected to the capacitor C and in which the capacitor C is charged at the voltages of the stacks 12a and 12b. Moreover, a circuit on the discharging side includes a pathway for discharging the power charged to the capacitor C.

Turning on and off of each of the switches S1 to S7 are controlled. Accordingly charge and discharge to/from the capacitor C are controlled. For example, solid state relays (SSR) can be used as the foregoing switches S1 to S7. However, the switches are not limited to SSR. Moreover, the first resistor R1 to the seventh resistor R7 are resistors for detecting a voltage of the capacitor C.

On the charging side of the voltage detection circuit portion 24, each of the first stack 12a and the second stack 12b is connected in parallel to the capacitor C. In other words, one side of the capacitor C is connected to a positive side of the first stack 12a and also of the second stack 12b, and the other side of the capacitor C is connected to a negative side of the first stack 12a and also of the second stack 12b.

The first resistor R1, the first switch S1 and the fifth resistor R5 are provided in series between the positive side of the first stack 12a and the capacitor C. The second resistor R2 and the second switch S2 are provided in series between the negative side of the first stack 12a and the capacitor C.

The third resistor R3, the third switch S3 and the fifth resistor R5 are provided in series between the positive side of the second stack 12b and the capacitor C. The fourth resistor R4 and the fourth switch S4 are provided in series between the negative side of the second stack 12b and the capacitor C.

On the discharging side of the voltage detection circuit portion 24, the fifth switch S5 is provided to pathways extended from the positive sides of the first stack 12a and the second stack 12b, and the fifth resistor R5 is provided between one end of the fifth switch S5 and the capacitor C.

The sixth switch S6 is provided to pathways extended from the negative sides of the first stack 12a and the second stack 12b, and one end of the sixth switch S6 is connected to the capacitor C.

Moreover, the other side of the fifth switch S5 is connected to the A/D converter 25, and is branched in the middle to be connected to the ground of the vehicle body via the sixth resistor R6. Moreover, the other side of the sixth switch S6 is connected to the ground of the vehicle body via the seventh resistor R7. The ground of the vehicle body is an example of an earth.

The A/D converter 25 converts an analogue value indicating a voltage of a connection point A of the voltage detection circuit portion 24 to a digital value, and then outputs the converted digital value to the controller 26.

Next, the first capacitor C1 and the second capacitor C2 will be described. It is recommended that the foregoing process of detecting the voltages of the first stack 12a and the second stack 12b should be completed in a relatively short time period. Thus, it is recommended that a capacitor used for detecting voltage should have a relatively small electrostatic capacitance because the capacitor can be charged in a short time period.

On the other hand, it is recommended that a capacitor used for deterioration detection of the insulation resistors Rp and Rn should have a relatively large electrostatic capacitance. In other words, a vehicle has a stray capacitance not designed in a design process. If the capacitor is affected by the stray capacitance during deterioration detection of the insulation resistors Rp and Rn, the voltage of the capacitor may not be detected accurately. Thus, accuracy of the deterioration detection may be decreased. Therefore, it is recommended to relatively increase the electrostatic capacitance of the capacitor used for deterioration detection for the insulation resistors Rp and Rn to decrease a percentage of the stray capacitance as compared to the entire electrostatic capacitance so that influence of the stray capacitance can be reduced.

Therefore, in this embodiment, the first capacitor C1 and the second capacitor C2 are configured as below. More specifically, the first capacitor C1 is connected in series to the fifth resistor R5. The second capacitor C2 is connected in series to the changeover switch S7.

Moreover, the second capacitor C2 and the changeover switch S7 are connected to the first capacitor C1 in parallel. Therefore, it is possible to easily switch between the capacitors to be connected in the circuits of the charging side and the discharging side by controlling turning on and off of the changeover switch S7. Accordingly, the entire electrostatic capacitance of each of those circuits can be changed.

More specifically, for example, when the changeover switch S7 is turned off during a process of detecting voltages of the stacks 12a and 12b, the process is performed with a relatively small electrostatic capacitance because only the first capacitor C1 is connected on the circuits of the charging side and the discharging side.

On the other hand, when the changeover switch S7 is turned on during a process of detecting deterioration of the insulation resistors Rp and Rn, the process is performed with a relatively large electrostatic capacitance because the first capacitor C1 and the second capacitor C2 are connected on the circuits of the charging side and the discharging side.

Here, the electrostatic capacitance of the second capacitor C2 is greater than the stray capacitance. More specifically, in a case where the stray capacitance of the vehicle is approx. 0.1 the electrostatic capacitance of the second capacitor C2 is set to 2.2 approx. 20 times of the stray capacitance of the vehicle. In this case, the electrostatic capacitance of the first capacitor C1 is, for example, 0.165 μF. As described above, the electrostatic capacitance of the second capacitor C2 is greater than the electrostatic capacitance of the first capacitor C1.

Thus, it is possible to increase the electrostatic capacitances of the capacitors, i.e., total capacitance of the first capacitor C1 and the second capacitor C2, used to detect deterioration of the insulation resistors Rp and Rn so that it is possible to further reduce influence of the stray capacitance relative to the entire capacitance.

As described above, the first capacitor C1 is used to detect voltages of the stacks 12a and 12b and also to detect deterioration of the insulation resistors Rp and Rn. The second capacitor C2 is used to detect deterioration of the insulation resistors Rp and Rn.

Next described will be charge and discharge to/from the voltage detection circuit portion 24 configured as described above. First, charge and discharge of the first capacitor C1 to detect the voltages of the first stack 12a and the second stack 12b will be described with reference to FIG. 4 to FIG. 6.

Figure 4:
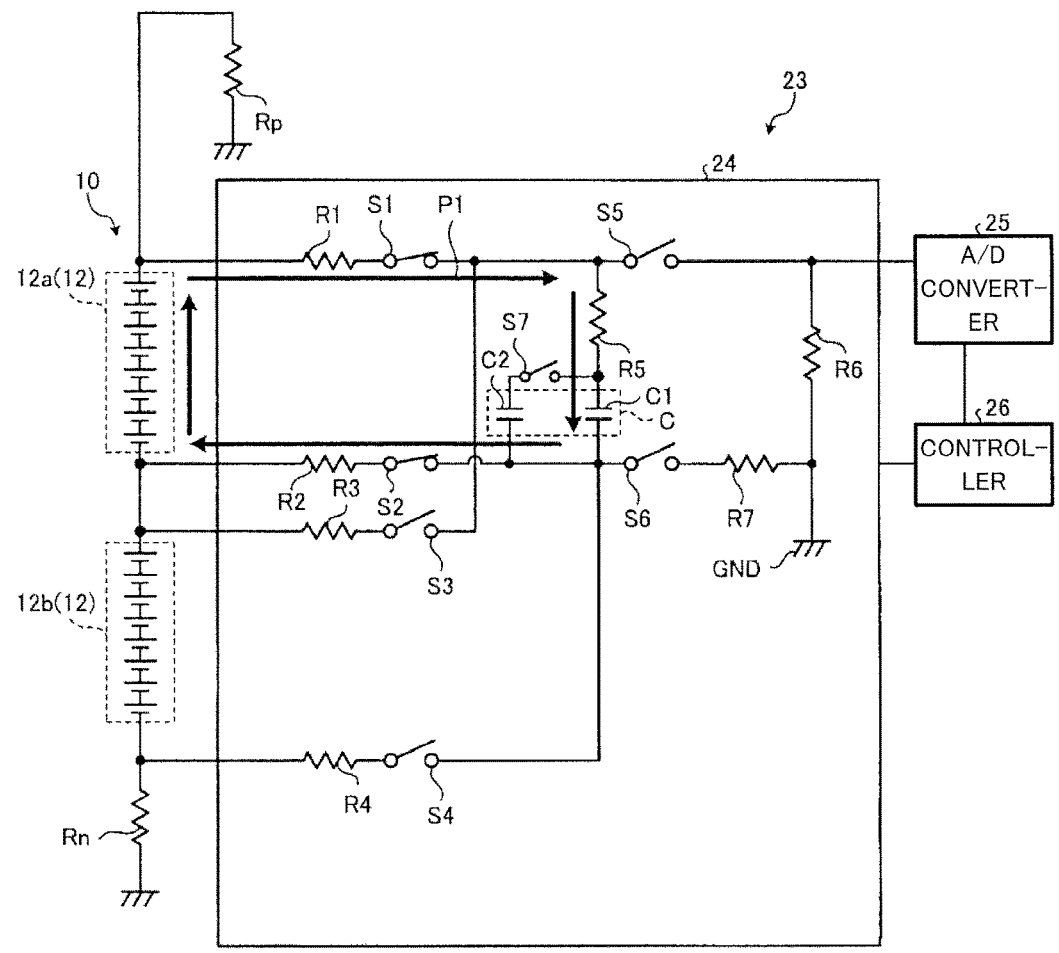
FIG. 4 illustrates a charging pathway to charge a first capacitor by a voltage of a first stack.
Figure 5:
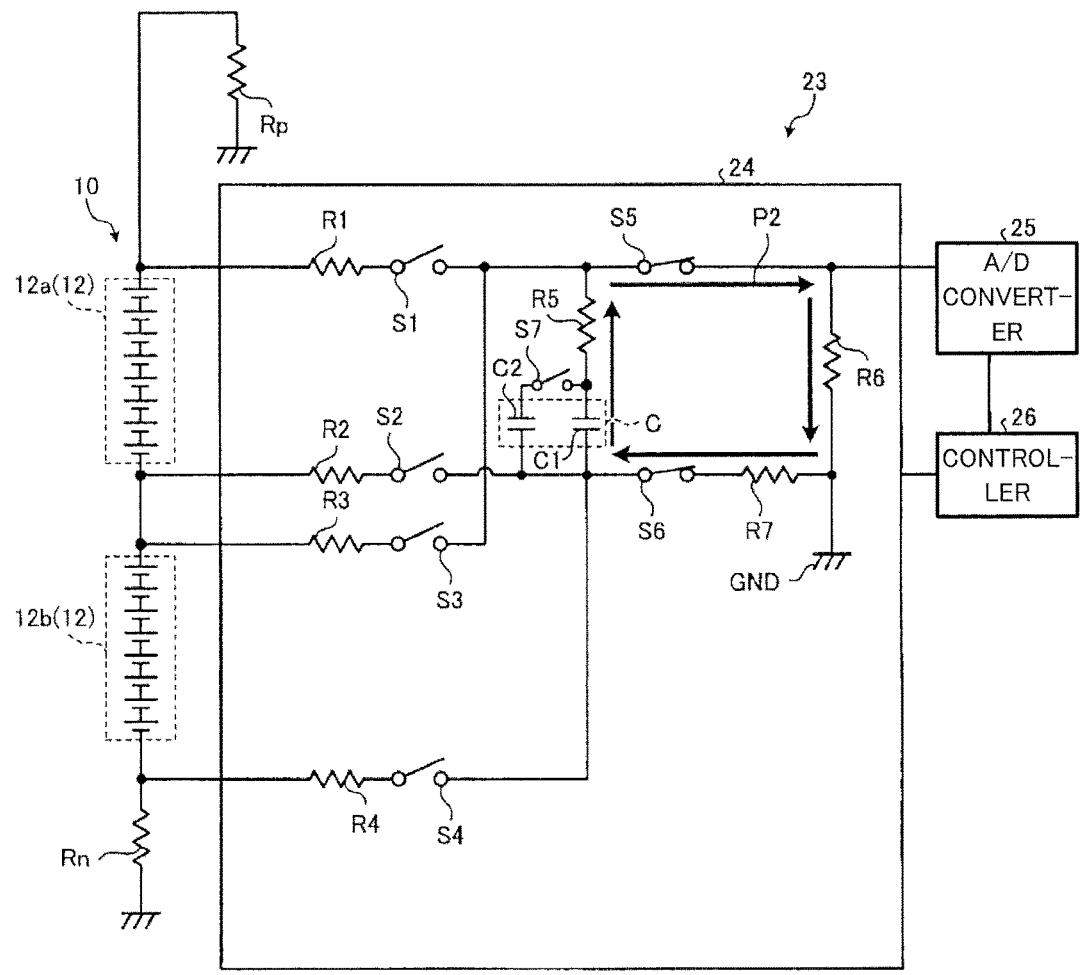
FIG. 5 illustrates a discharging pathway to discharge the charged first capacitor.
Figure 6:
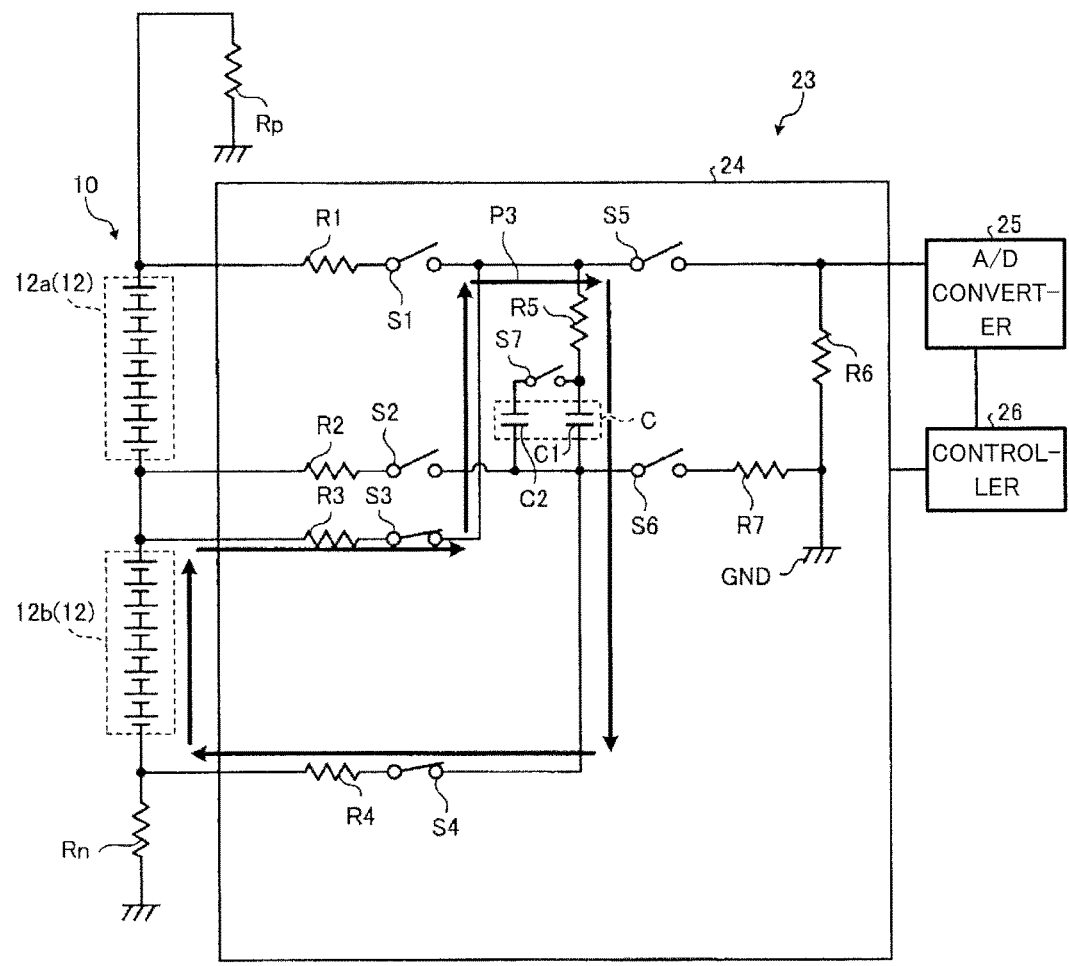
FIG. 6 illustrates a charging pathway to charge the first capacitor by a voltage of a second stack.

FIG. 4 illustrates a charging pathway to charge the first capacitor C1 by the voltage of the first stack 12a. FIG. 5 illustrates a discharging pathway to discharge the charged first capacitor C1. FIG. 6 illustrates a charging pathway to charge the first capacitor C1 by the voltage of the second stack 12b.

In the power supply monitoring apparatus 23, the first capacitor C1 is charged by the first stack 12a and the second stack 12b, separately. First described will be an example in which the first capacitor C1 is charged by the voltage of the first stack 12a (hereinafter also referred to as "first stack voltage"). As illustrated in FIG. 4, the first switch S1 and the second switch S2 are turned on and the other switches S3 to S7 are turned off.

Thus, the positive side of the first stack 12a is connected to the negative side of the first stack 12a via the first resistor R1, the first switch S1, the fifth resistor R5, the first capacitor C1, the second switch S2 and the second resistor R2. In other words, a first pathway P1 is formed that connects the first stack 12a with the first capacitor C1, and thus the first capacitor C1 is charged by the first stack voltage.

Once a predetermined time period passes after the first pathway P1 has been formed, the voltage of the first capacitor C1 is discharged. More specifically, as illustrated in FIG. 5, the first switch S1 and the second switch S2 are turned off and, at the same time, the fifth switch S5 and the sixth switch S6 are turned on.

Thus, a second pathway P2 that is a discharging pathway is formed on the voltage detection circuit portion 24. Since one end of the fifth switch S5 is connected to the A/D converter 25, once the second pathway P2 is formed, the voltage of the first capacitor C1 (i.e., the first stack voltage) is input to the A/D converter 25. Once the fifth switch S5 and the sixth switch S6 are turned on, the A/D converter 25 convers an input analogue value into a digital value and then outputs the converted digital value to the controller 26. Thus, the first stack voltage is detected.

Next described will be an example in which the first capacitor C1 is charged by the voltage of the second stack 12b (hereinafter also referred to as "second stack voltage"). As illustrated in FIG. 6, the third switch S3 and the fourth switch S4 are turned on and the other switches S1, S2 and S5 to S7 are turned off.

Thus, the positive side of the second stack 12b is connected to the negative side of the second stack 12b via the third resistor R3, the third switch S3, the fifth resistor R5, the first capacitor C1, the fourth switch S4 and the fourth resistor R4. In other words, a third pathway P3 is formed that connects the second stack 12b with the first capacitor C1, and thus the first capacitor C1 is charged by the second stack voltage. The first pathway P1 and the third pathway P3 are examples of the first charging pathway.

Once a predetermined time period passes after the third pathway P3 has been formed, the third switch S3 and the fourth switch S4 are turned off, and at the same time, the fifth switch S5 and the sixth switch S6 are turned on, and thus the voltage of the first capacitor C1 is discharged (refer to FIG. 5).

Thus, the second pathway P2 is formed on the voltage detection circuit portion 24. The voltage of the first capacitor C1 (i.e., the second stack voltage) is input to the A/D converter 25. Similarly, as described above, the A/D converter 25 convers an input analogue voltage value into a digital value, and then outputs the converted digital value to the controller 26. Thus, the second stack voltage is detected.

As described above, since the first capacitor C1 is charged and discharged by switching between the pathways for discharge and charge, the first stack voltage and the second stack voltage can be detected.

In the processes of detecting the first stack voltage and the second stack voltage, the first capacitor C1 is not necessarily fully charged. In other words, for example, in the process of detecting the first stack voltage and the second stack voltage, the first capacitor C1 is charged for a time period shorter than a time period necessary to be fully charged, and then each of the first stack voltage and the second stack voltage may be estimated based on the voltage of the charged first capacitor C1. Thus, it is possible to shorten a time for the process of detecting the first stack voltage and the second stack voltage.

As illustrated in FIG. 3, the insulation resistor Rp on the positive side and the insulation resistor Rn on the negative side of the foregoing assembled battery 10 are provided to the circuit of the voltage detection circuit portion 24. Each of the insulation resistors Rp and Rn shows a resistance combined a resistance of a mounted resistor with a virtual resistance indicating insulation from the ground of the vehicle body. However, each of the insulation resistors Rp and Rn may be a mounted resistor or a virtual resistance indicating insulation to the ground of the vehicle body.

Resistance values of the insulation resistors Rp and Rn are, for example, some MΩ, large enough to hardly be applied at a normal time. However, at an abnormal time at which the insulation resistors Rp and Rn are deteriorated, the resistance values thereof are reduced to values that allow the electricity to be conducted due to a short circuit of the assembled battery 10 to the ground and the like of the vehicle body or due to a state close to the short circuit.

Here, charge and discharge of the capacitor C (i.e., the first and second capacitors C1 and C2) to detect deterioration of the insulation resistors Rp and Rn of the assembled battery 10, will be described with reference to FIGS. 7 to 10.

Figure 7:
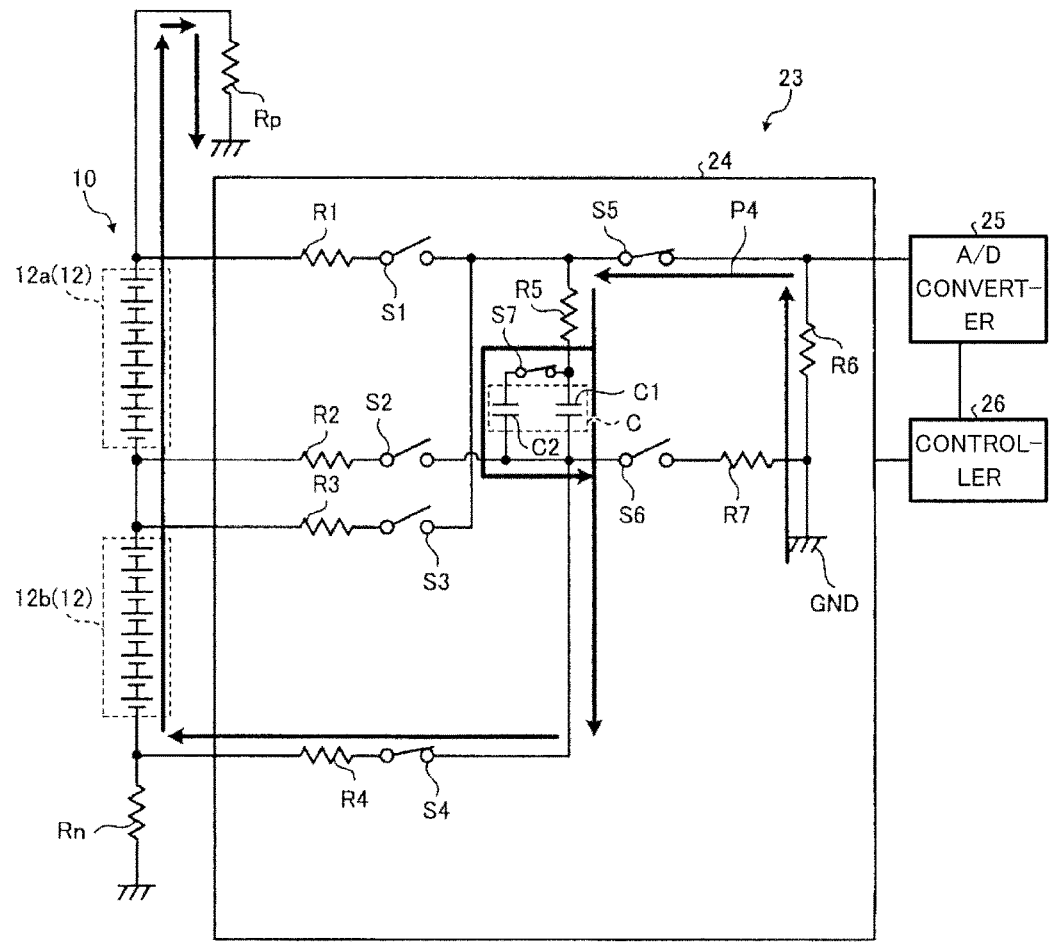
FIG. 7 illustrates a charging pathway to detect deterioration of an insulation resistor on a positive side of an assembled battery.
Figure 8:
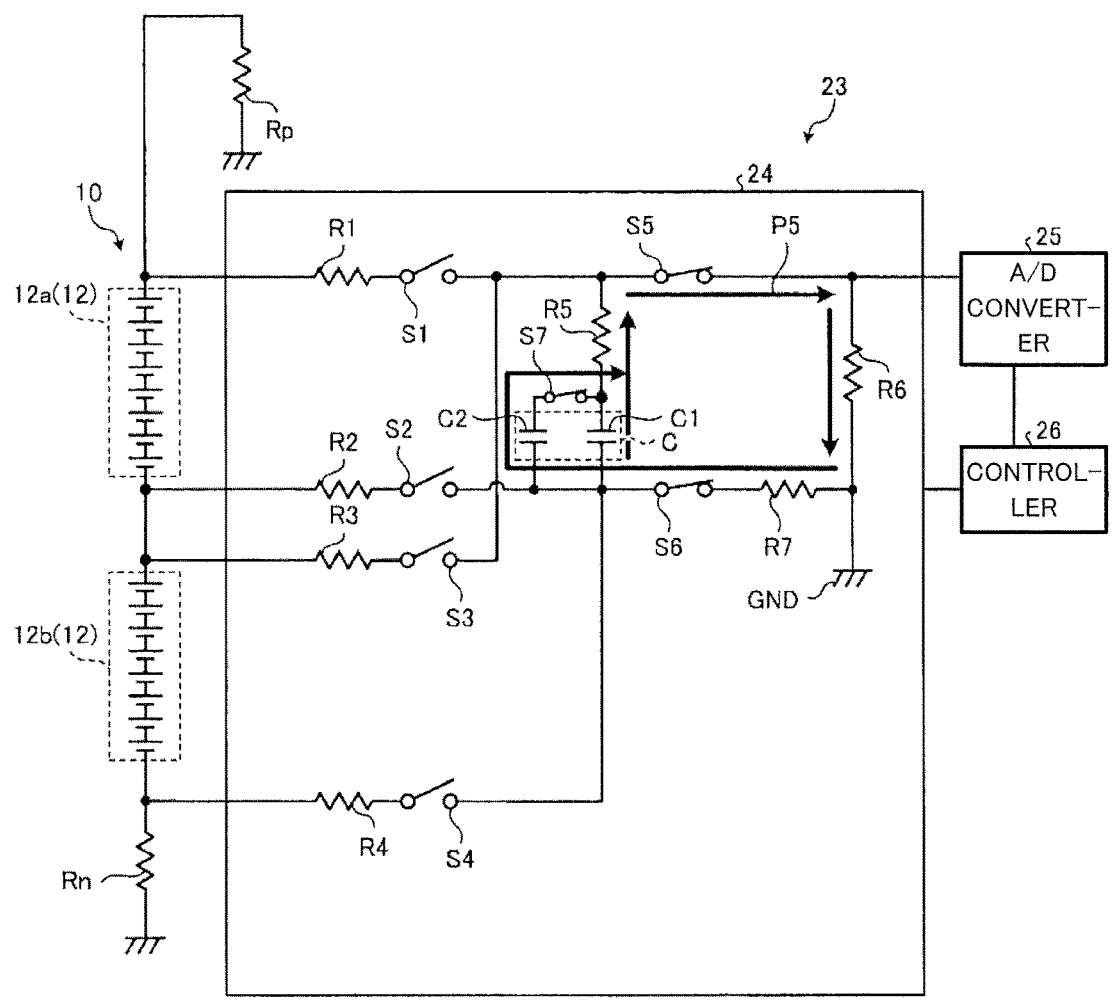
FIG. 8 illustrates a discharging pathway to discharge a charged capacitor.
Figure 9:
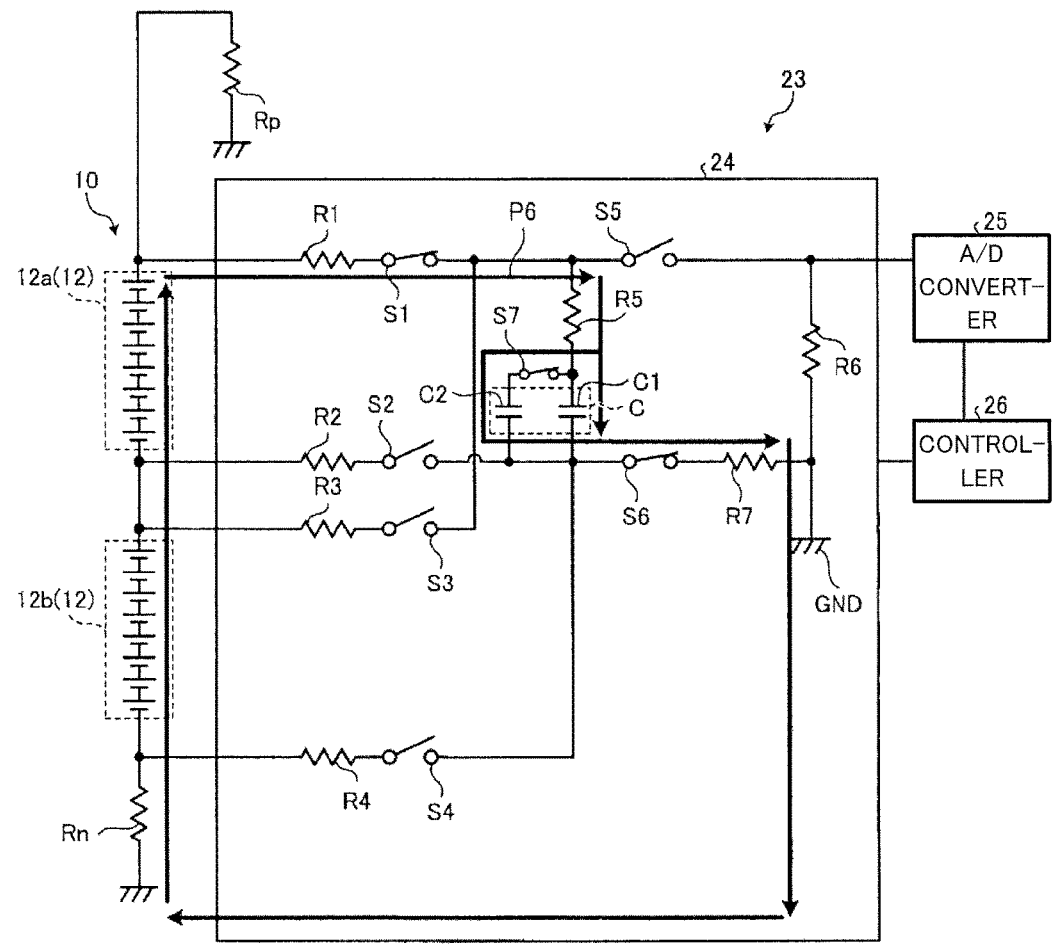
FIG. 9 illustrates a charging pathway to detect deterioration of an insulation resistor on a negative side of the assembled battery.

FIG. 7 illustrates a charging pathway to detect deterioration of the insulation resistor Rp on a positive side of the assembled battery 10. FIG. 8 illustrates a discharging pathway to discharge the charged capacitor C. FIG. 9 illustrates a charging pathway to detect deterioration of the insulation resistor Rn on a negative side of the assembled battery 10.

First, in order to detect the deterioration of the insulation resistor Rp on the positive side, the fourth switch S4, the fifth switch S5 and the changeover switch S7 are turned on, and the other switches S1 to S3 and S6 are turned off, as illustrated in FIG. 7. Thus, the positive side of the first stack 12a is connected to the negative side of the first stack 12a via the insulation resistor Rp, the sixth resistor R6, the fifth switch S5, the fifth resistor R5, the capacitor C, the fourth switch S4, the fourth resistor R4 and the second stack 12b.

In other words, a fourth pathway P4 is formed that connects the first stack 12a and the second stack 12b with the capacitor C via the insulation resistor Rp on the positive side. At this time, in a case where the resistance value of the insulation resistor Rp is normal, the fourth pathway P4 little conducts electricity. In a case where the resistance value of the insulation resistor Rp is reduced due to deterioration of the insulation resistor Rp, the fourth pathway P4 conducts electricity.

Once a predetermined time period passes after the fourth pathway P4 has been formed, the voltage of the capacitor C is discharged. More specifically, as illustrated in FIG. 8, the fourth switch S4 is turned off, and at the same time, the sixth switch S6 is turned on. Thus, a fifth pathway P5, a discharging pathway, is formed on the voltage detection circuit portion 24. The voltage of the capacitor C detected at this time is referred to as "voltage VRp," and deterioration of the insulation resistor Rp is detected based on the voltage VRp. The voltage VRp will be described later.

In order to detect the deterioration of the insulation resistor Rn on the negative side, the first switch S1, the sixth switch S6 and the changeover switch S7 are turned on, and the other switches S2 to S5 are turned off, as illustrated in FIG. 9. Thus, the positive side of the first stack 12a is connected to the negative side of the first stack 12a via the first resistor R1, the first switch S1, the fifth resistor R5, the capacitor C, the sixth switch S6, the seventh resistor R7, the insulation resistor Rn and the second stack 12b.

In other words, a sixth pathway P6 is formed that connects the first stack 12a and the second stack 12b with the capacitor C via the insulation resistor Rn on the negative side. At this time, in a case where the resistance value of the insulation resistor Rn is normal, the sixth pathway P6 little conducts electricity. In a case where the resistance value of the insulation resistor Rn is reduced due to deterioration of the insulation resistor Rn, the sixth pathway P6 conducts electricity.

Once a predetermined time period passes after the sixth pathway P6 has been formed, as illustrated in FIG. 8, the voltage of the capacitor C is discharged. The voltage of the capacitor C detected at this time is referred to as "voltage VRn," and deterioration of the insulation resistor Rn is detected based on the voltage VRn. The voltage VRp will be described later. The foregoing fourth pathway P4 and the foregoing sixth pathway P6 are examples of a second charging pathway.

In the processes of detecting the deterioration of the insulation resistors Rp and Rn, the capacitor C is charged for a time period shorter than a time period necessary to be fully charged, and the charged voltages are used as the voltage VRp and the voltage VRn to detect deterioration of the insulation resistors Rp and Rn.

In the processes of detecting the voltages of the first stack 12a and the second stack 12b and in the processes of detecting deterioration of the insulation resistors Rp and Rn, described above, the first switch S1, the second switch S2, the third switch S3 and the fourth switch S4 that are connected to the positive sides and the negative sides of the first and second stacks 12a and 12b, have to work normally. In other words, it is better to confirm a state of each switch on a high pressure side before the processes of detecting the voltages and/or the deterioration of the insulation resistors described above.

Figure 10:
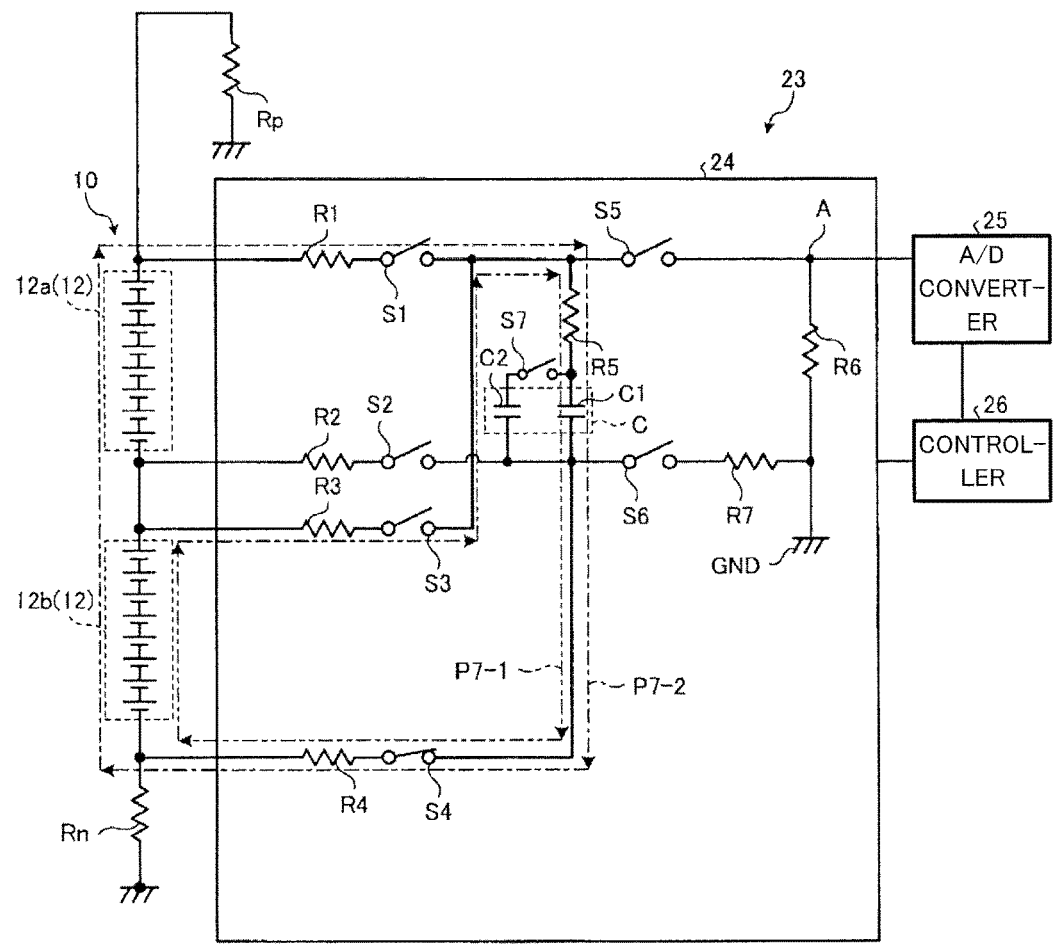
Figure 11:
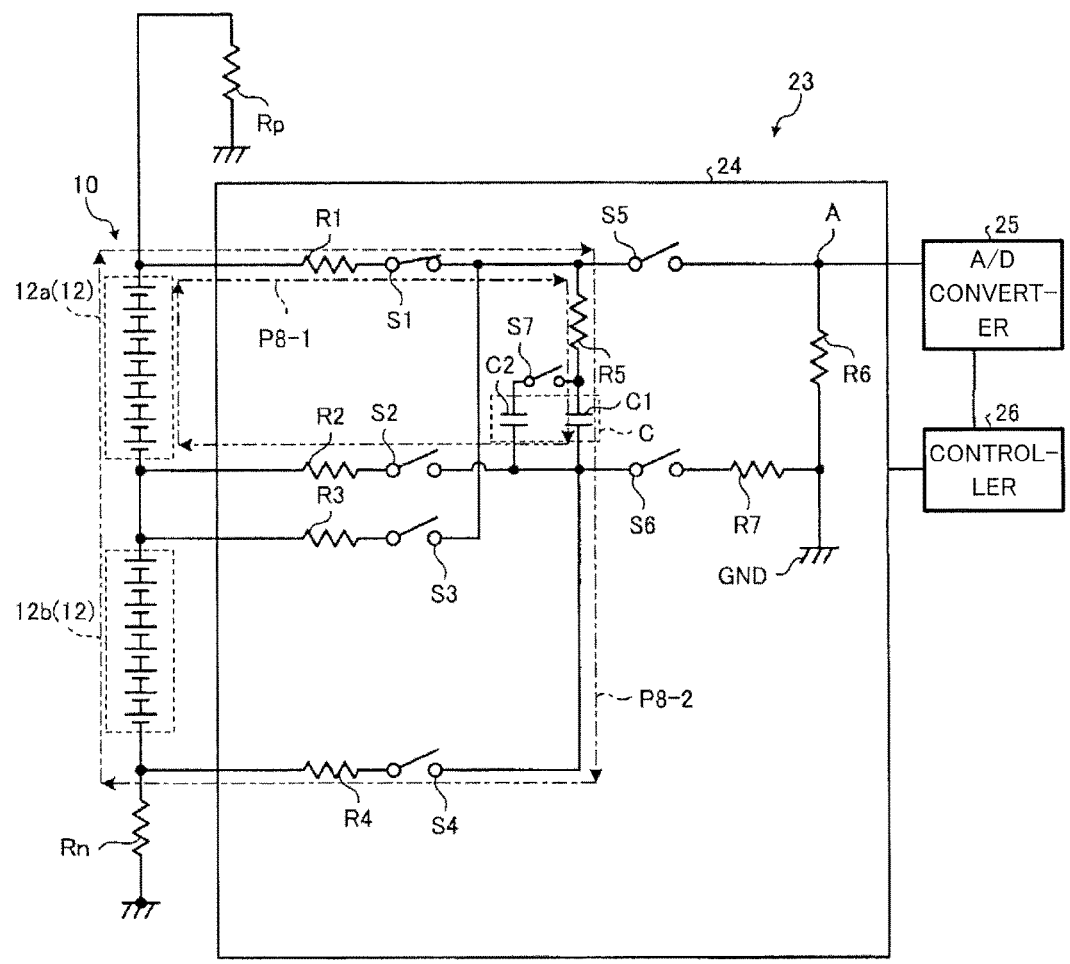

Here, next described, with reference to FIGS. 10 and 11, will be an example in which states of the first switch S1 and the fourth switch S4 are determined by measuring a voltage of the capacitor C (or the first capacitor C1) when the first switch S1 or the fourth switch S4 is turned on.

FIG. 10 illustrates a charging circuit when the fourth switch S4 is turned on. FIG. 11 illustrates a charging circuit when the first switch S1 is turned on.

As illustrated in FIG. 10, the fourth switch S4 is turned on and the other switches S1 to S3 and S5 to S7 are turned off. Then, once a predetermined time period passes, the fourth switch S4 is turned off, and at the same time, the fifth switch S5 and the sixth switch S6 are turned on to discharge the voltage of the capacitor C (the first capacitor C1) (refer to FIG. 5). As described above, the voltage of the capacitor C (the first capacitor C1) is measured. In this embodiment, the voltage measured as described above is referred to as "V1."

At this time, if all the switches are good, since all the switches other than the fourth switch S4 are off, the charging pathway is not formed, i.e., electric current does not flow, so that the capacitor C is not charged. Therefore, if the voltage of the capacitor C is obtained after only the fourth switch S4 is turned on, it can be determined that any of the switches on the high pressure side is broken.

For example, if the third switch S3 is in an ON position stuck state, i.e., the third switch S3 cannot be turned off, the positive side of the second stack 12b is connected to the negative side of the second stack 12b via the third resistor R3, the third switch S3, the fifth resistor R5, the first capacitor C1, the fourth switch S4 and the fourth resistor R4. In other words, a seventh pathway P7-1 that is a charging pathway connecting the second stack 12b with the first capacitor C1 is formed, and the first capacitor C1 is charged from the second stack 12b.

Similarly, if the first switch S1 is in the ON position stuck state, i.e., the first switch S1 cannot be turned off, the positive side of the first stack 12a is connected to the negative side of the second stack 12b via the first resistor R1, the first switch S1, the fifth resistor R5, the first capacitor C1, the fourth switch S4 and the fourth resistor R4. In other words, a seventh pathway P7-2 that is a charging pathway connecting the first stack 12a and the second stack 12b with the first capacitor C1 is formed, and the first capacitor C1 is charged from the first stack 12a and the second stack 12b.

As illustrated in FIG. 11, the first switch S1 is turned on and the other switches S2 to S7 are turned off. Then, once a predetermined time period passes, the first switch S1 is turned off, and at the same time, the fifth switch S5 and the sixth switch S6 are turned on to discharge the voltage of the capacitor C (the first capacitor C1) (refer to FIG. 5). As described above, the voltage of the capacitor C (the first capacitor C1) is measured. In this embodiment, the voltage measured as described above is referred to as "V2."

At this time, if all the switches are good, since all the switches other than the first switch S1 are off, the charging pathway is not formed, i.e., electric current does not flow, so that the capacitor C is not charged. Therefore, if the voltage of the capacitor C is obtained after only the first switch S1 is turned on, it can be determined that any of the switches on the high pressure side is broken.

For example, if the second switch S2 is in the ON position stuck state, i.e., the second switch S2 cannot be turned off, the positive side of the first stack 12a is connected to the negative side of the first stack 12a via the first resistor R1, the first switch S1, the fifth resistor R5, the first capacitor C1, the second switch S2 and the second resistor R2. In other words, an eighth pathway P8-1 that is a charging pathway connecting the first stack 12a with the first capacitor C1 is formed, and the first capacitor C1 is charged from the first stack 12a.

Similarly, if the fourth switch S4 is in the ON position stuck state, i.e., the fourth switch S4 cannot be turned off, the positive side of the first stack 12a is connected to the negative side of the second stack 12b via the first resistor R1, the first switch S1, the fifth resistor R5, the first capacitor C1, the fourth switch S4 and the fourth resistor R4. In other words, an eighth pathway P8-2 that is a charging pathway connecting the first stack 12a and the second stack 12b with the first capacitor C1 is formed, and the first capacitor C1 is charged from the first stack 12a and the second stack 12b.

With reference back to FIG. 2, the controller 26 of the power supply monitoring apparatus 23 is a microcomputer including a CPU (central processing unit), a RAM (random access memory), a ROM (read only memory), etc., and controls the entire power supply monitoring apparatus 23 including the voltage detection circuit portion 24 and the A/D converter 25.

More specifically, the controller 26 includes a charging and discharging pathway forming part 26a, a voltage detector 26b, a power supply monitoring part 26c and a switch monitoring part 26d. The charging and discharging pathway forming part 26a forms the first, third, fourth and sixth pathways P1, P3, P4 and P6 that are charging pathways, and the second and fifth pathways P2 and P5 that are discharging pathways. Moreover, the charging and discharging pathway forming part 26a forms the pathways P7-1 and P7-2, described with reference to FIG. 10, and the pathways P8-1 and P8-2, described with reference to FIG. 11.

More specifically, the charging and discharging pathway forming part 26a includes a first-to-sixth switches controller 26a1 and a capacitor changeover part 26a2. The first-to-sixth switches controller 26a1 controls the first switch S1 to the sixth switch S6 to form the charging pathway or the discharging pathway.

The capacitor changeover part 26a2 controls the changeover switch S7 to switch between the capacitors to be connected in the charging pathway or in the discharging pathway. More specifically, the capacitor changeover part 26a2 controls the changeover switch S7 to switch between the charging pathway (the first pathway P1/the third pathway P3) that includes the first capacitor C1 and that does not include the second capacitor C2 and the charging pathway (the fourth pathway P4/the sixth pathway P6) that includes the first capacitor C1 and the second capacitor C2.

In a case of the discharging pathway, similar to the case of the charging pathway, the capacitor changeover part 26a2 controls the changeover switch S7 to switch between the discharging pathway (the second pathway P2) that includes the first capacitor C1 and that does not include the second capacitor C2 and the discharging pathway (the fifth pathway P5) that includes the first capacitor C1 and the second capacitor C2.

Switching patterns for the first switch S1 to the sixth switch S6 and the changeover switch S7 are stored in a memory, such as a RAM or a ROM. The charging and discharging pathway forming part 26a reads out the switching pattern from the memory at a right moment to form the charging pathway or the discharging pathway.

When the discharging pathway is formed by the charging and discharging pathway forming part 26a, the voltage detector 26b detects voltages of the charged first capacitor C1 and the like via the A/D converter 25. The voltage detector 26b is configured to detect the first stack voltage, the second stack voltage, the voltage VRp, the voltage VRn, the voltage V1 and the voltage V2 described above.

The voltage detector 26b outputs signals indicative of the detected first stack voltage, the detected second stack voltage, etc., to the power supply monitoring part 26c. Moreover, the voltage detector 26b outputs the detected voltage V1 and the detected voltage V2 to the switch monitoring part 26d.

The power supply monitoring part 26c monitors charged states of the first stack 12a and the second stack 12b based on the first stack voltage and the second stack voltage. Then, the power supply monitoring part 26c outputs, to the vehicle controller 30 (refer to FIG. 1), information indicative of a result of monitoring the charged state of the assembled battery 10 including the first stack 12a and the second stack 12b. As described above, the vehicle controller 30 controls the vehicle based on the result of monitoring the charged state of the assembled battery 10.

The power supply monitoring part 26c further detects deterioration of the insulation resistors Rp and Rn based on the voltages VRp and VRn.

More specifically, in a case where the insulation resistor Rp or the insulation resistor Rn are not deteriorated so that the resistance values thereof are not reduced, the capacitor C is little charged, or if the capacitor C is charged, the charged voltage is very low. Therefore, the power supply monitoring part 26c compares the voltage VRp or the voltage VRn to a threshold value Va set beforehand at a relatively low value.

In a case where the voltage VRp of the capacitor C is equal to or exceeds the threshold value Va, the power supply monitoring part 26c detects deterioration of the insulation resistor Rp. In other words, the power supply monitoring part 26c determines that the insulation resistor Rp has a problem. On the other hand, in a case where the voltage VRp of the capacitor C is below the threshold value Va, the power supply monitoring part 26c determines that the insulation resistor Rp is not deteriorated, i.e., the insulation resistor Rp is normal.

Similarly, in a case where the voltage VRn is equal to or exceeds the threshold value Va, the power supply monitoring part 26c detects deterioration of the insulation resistor Rn. On the other hand, in a case where the voltage VRn is below the threshold value Va, the power supply monitoring part 26c determines that the insulation resistor Rn is not deteriorated. The same threshold value Va is used for comparison to the voltage VRn and the voltage VRp in the description above. However, the threshold value for the voltage VRn and the voltage VRp is not limited to one value, but a threshold value to be compared to the voltage VRn and a threshold value to be compared to the voltage VRp may be different.

The power supply monitoring part 26c outputs, to the vehicle controller 30 and the like, information indicative of a result of the deterioration of the foregoing insulation resistors Rp and Rn. Then, the vehicle controller 30 controls the vehicle and informs the user in accordance with the deterioration.

As described above, the power supply monitoring part 26c detects the stack voltages and the deterioration of the insulation resistors Rp and Rn based on the voltage of the capacitor charged through the first pathway P1/the third pathway P3 or through the fourth pathway P4/the sixth pathway P6 that are switched between by the capacitor changeover part 26a2.

The switch monitoring part 26*d* determines a state of each of the first switch S1 to the fourth switch S4 that are the switches on the high pressure side, using the foregoing voltage V1 and the voltage V2. More specifically, the switch monitoring part 26*d* compares the voltage V1 and the voltage V2 to a threshold value A and a threshold value B, to identify a faulty switch.

The switch monitoring part 26*d* determines a cell stack to which the faulty switch is connected, based on number of cell stacks connected in series to which each of the measured voltages (V1 and V2) is equivalent. Therefore, it is recommended that the threshold value A and the threshold value B should be set based on voltages of the cell stacks.

For example, each threshold value can be set to a value obtained by multiplying the voltage value of the cell stack by an integer number. For example, in a case where a voltage value of one cell stack is known as "Vs (V)" from specifications and the like, the threshold value A is set to "1×Vs=Vs," and the threshold value B is set to "2×Vs=2Vs."

Moreover, the threshold values A and B can be set based on the voltage value of each cell stack or on a total voltage value of the power supply. For example, the voltage value of the first stack 12*a* is set as the threshold value A, and the total voltage value obtained by adding the voltage value of the first stack 12*a* to the voltage value of the second stack 12*b* can be set as the threshold value B. Moreover, the threshold value A can be set to a value obtained by subtracting the voltage value of the first stack 12*a* from a total voltage value "Vt," estimated beforehand, and then the threshold value B can be set to a value obtained by adding the threshold value A to the voltage value of the second stack 12*b*.

Moreover, a tolerance ±α may be added to the threshold values to obtain threshold values considering an error, deterioration, etc. Moreover, the voltage value of each cell stack or the total voltage value of the power supply can be specified based on the result of monitoring the charged states of the first stack 12*a* and the second stack 12*b*. The threshold values can be changed dynamically before the state of each switch is determined, by use of a result of previous stack voltage detection and the method of setting the threshold values. Moreover, the threshold values may be changed dynamically, by use of a result of previous deterioration detection for the insulation resistors Rp and Rn.

Using such a threshold value, in a case where the voltage V1 of the capacitor C is below the threshold value A, the switch monitoring part 26*d* determines that the first switch S1 and the third switch S3 are normal. Moreover, in a case where the voltage V1 of the capacitor C is equal to or exceeds the threshold value A but is below the threshold value B, the switch monitoring part 26*d* specifies the seventh pathway P7-1 as the charging pathway to the capacitor C (refer to FIG. 10), and then determines that the third switch S3 is in the ON position stuck state. Further, in a case where the voltage V1 of the capacitor C is equal to or exceeds both of the threshold values A and B, the switch monitoring part 26*d* specifies the seventh pathway P7-2 as the charging pathway to the capacitor C (refer to FIG. 10), and then determines that the first switch S1 is in the ON position stuck state.

Similarly, in a case where the voltage V2 of the capacitor C is below the threshold value A, the switch monitoring part 26*d* determines that the second switch S2 and the fourth switch S4 are normal. Moreover, in a case where the voltage V2 of the capacitor C is equal to or exceeds the threshold value A but is below the threshold value B, the switch monitoring part 26*d* specifies the eighth pathway P8-1 as the charging pathway to the capacitor C (refer to FIG. 11), and then determines that the second switch S2 is in the ON position stuck state. Further, in a case where the voltage V2 of the capacitor C is equal to or exceeds both of the threshold values A and B, the switch monitoring part 26*d* specifies the eighth pathway P8-2 as the charging pathway to the capacitor C (refer to FIG. 11), and then determines that the fourth switch S4 is in the ON position stuck state.

Then, the switch monitoring part 26*d* outputs, to an upper ECU, such as the vehicle controller 30 and the like, information indicative of the result of the determined states of the first switch S1 to the fourth switch S4. Then, the upper ECU, such as the vehicle controller 30, controls the vehicle and informs the user in accordance with the determined result.

<3. Concrete Operation of Charged State Monitoring Process and Deterioration Detection Process>

Figure 12:
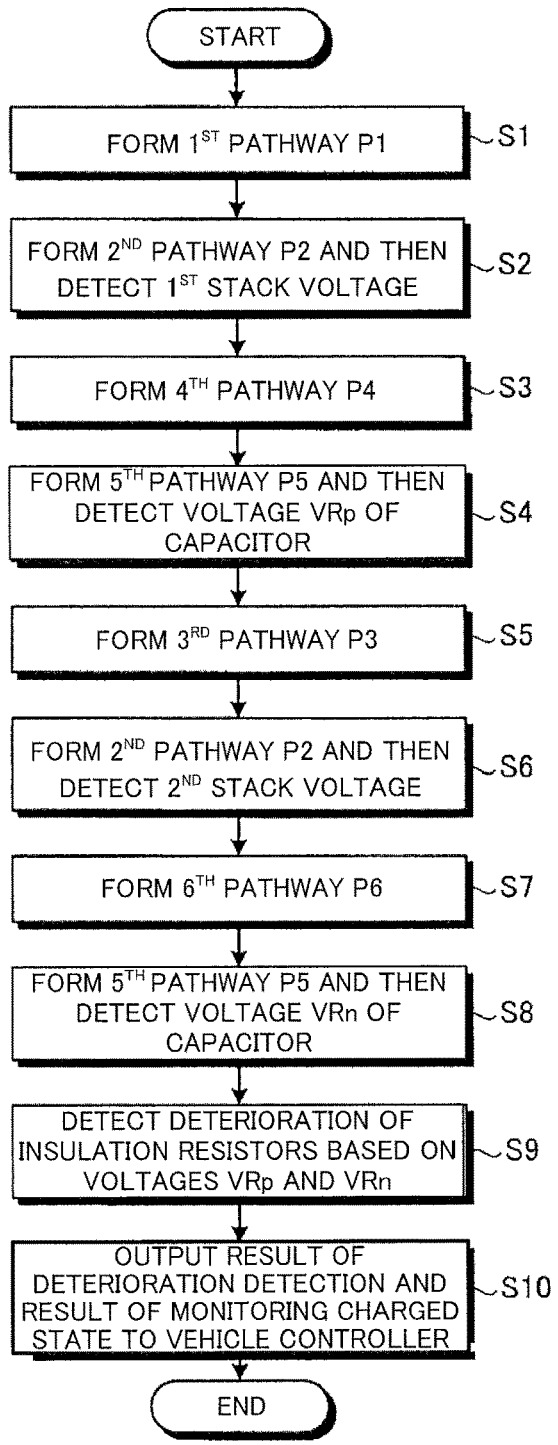
FIG. 12 illustrates a flowchart showing partial process steps of a monitoring and detection process performed by the power supply monitoring system.

Next described, with reference to FIG. 12, will be a charged state monitoring process and a deterioration detection process that are performed by the power supply monitoring system 20 configured as described above. FIG. 12 illustrates a flowchart showing partial process steps of the monitoring and detection process performed by the power supply monitoring system 20. Each step shown in FIG. 12 is performed based on control performed by the controller 26 included in the power supply monitoring apparatus 23.

As illustrated in FIG. 12, the controller 26 first controls the changeover switch S7 and the like to form the first pathway P1 (a step S1). Next, after a predetermined time period passed, the controller 26 forms the second pathway P2 and then detects the first stack voltage (a step S2).

Then, the controller 26 controls the changeover switch S7 and the like to form the fourth pathway P4 (a step S3). Then, once the predetermine time period passes, the controller 26 controls the changeover switch S7 and the like to form the fifth pathway P5 and then detects the voltage VRp of the capacitor C (a step S4).

Next, the controller 26 controls the changeover switch S7 and the like to form the third pathway P3 (a step S5). Then, once the predetermined time period passes, the controller 26 controls the changeover switch S7 and the like to form the second pathway P2 and then detects the second stack voltage (a step S6).

Next, the controller 26 controls the changeover switch S7 and the like to form the sixth pathway P6 (a step S7). Then, once the predetermined time period passed, the controller 26 controls the changeover switch S7 and the like to form the fifth pathway P5 and then detects the voltage VRn of the capacitor C (a step S8).

Then, the controller 26 detects deterioration of the insulation resistors Rp and Rn based on the voltages VRp and VRn of the capacitor C detected in the steps S4 and S8 (a step S9). Next, the controller 26 outputs, to the vehicle controller 30, information indicative of the deterioration of the insulation resistors Rp and Rn as a result of deterioration detection, and the first and second stack voltages as a result of monitoring the charged state of the assembled battery 10 (a step 510).

In the description above, the voltages are detected in order, starting with the first stack voltage, and then the voltage VRp, the second stack voltage and the voltage VRn. However, the order is an example. A detection order is not limited to the example but can be set arbitrarily.

<4. Concrete Operation of State Determination Process for the Switches on the High Pressure Side>

Figure 13:
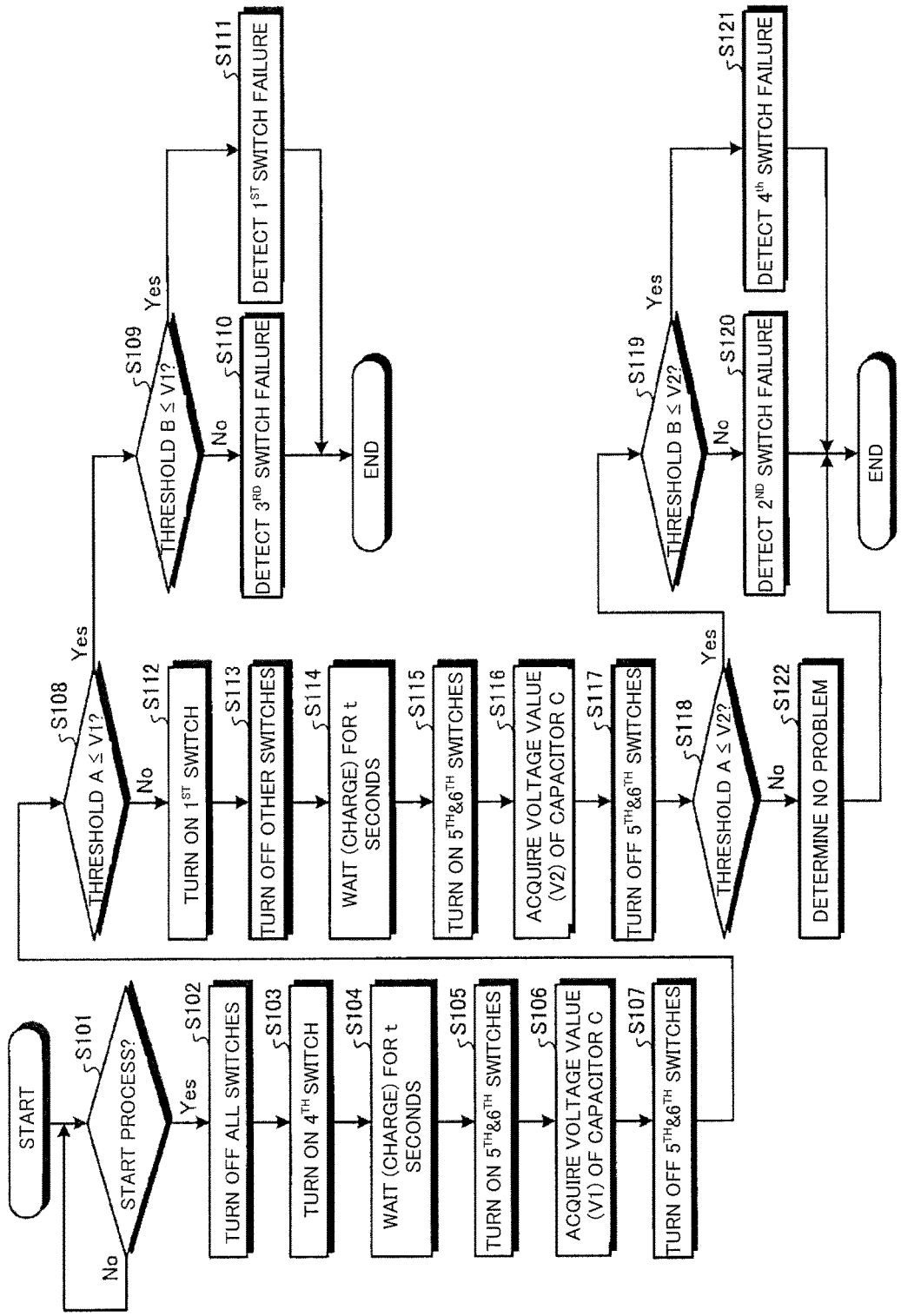
FIG. 13 illustrates a flowchart showing partial process steps of a state determination process performed by the power supply monitoring system.

Next described, with reference to FIG. 13, will be a concrete operation of a state determination process for the switches on the high pressure side that is performed by the power supply monitoring system 20 configured as described above. FIG. 13 illustrates a flowchart showing partial process steps of the state determination process performed by the power supply monitoring system 20. Each step shown in FIG. 13 is performed based on control performed by the controller 26 included in the power supply monitoring apparatus 23. Moreover, the process may be performed before the charged state monitoring process and the deterioration detection process. The process may be performed as a pre-process of the charged state monitoring process and the deterioration detection process to be performed N+1 times after the charged state monitoring process and the deterioration detection process have been performed N times.

As illustrated in FIG. 13, once a command for start of the process is given (Yes in a step S101), the controller 26 turns off all of the switches (a step S102), turns on the fourth switch S4 (a step S103), and then waits fort seconds to charge the capacitor C (a step S104).

Then, the controller 26 turns on the switches S5 and S6 (a step S105), and acquires the voltage value (V1) of the capacitor C (a step S106). Then, the controller 26 turns off the switches S5 and S6 (a step S107).

Here, in a case where the acquired voltage (V1) is equal to or exceeds the threshold value A but is below the threshold value B (Yes in a step S108 and No in a step S109), the controller 26 detects a failure of the third switch S3 (a step S110). Further, in a case where the acquired voltage (V1) is equal to or exceeds both of the threshold values A and B (Yes in the step S108 and Yes in the step S109), the controller 26 detects a failure of the first switch S1 (a step S111).

On the other hand, in a case where the acquired voltage (V1) is below the threshold value A (No in the step S108), the controller 26 turns on the first switch S1 (a step S112), turns off the other switches (a step S113) and waits for t seconds to charge the capacitor C (a step S114).

Then, the controller 26 turns on the fifth switch S5 and the sixth switch S6 (a step S115), and then acquires the voltage value (V2) of the capacitor C (a step S116). Then, the controller 26 turns off the fifth switch S5 and the sixth switch S6 (a step S117).

Here, in a case where the acquired voltage (V2) is equal to or exceeds the threshold value A but is below the threshold value B (Yes in a step S118 and No in a step 119), the controller 26 detects a failure of the second switch S2 (a step S120). Moreover, in a case where the acquired voltage (V2) is equal to or exceeds both of the threshold values A and B (Yes in the step S118 and Yes in the step 119), the controller 26 detects a failure of the fourth switch S4 (a step S121).

On the other hand, in a case where the acquired voltage (V2) is below the threshold value A (No in the step S118), the controller 26 determines that the first switch S1 to the fourth switch S4 are working normally (a step S122). In a case where the controller 26 continuously acquires the voltage (V1) and the voltage (V2) of the capacitor C to determine whether or not one of the switches fails, the controller 26 may perform a discharging process after each determination. Moreover, the controller 26 may acquire the voltage (V2) without performing the discharging process after acquiring the voltage (V1), and then the controller 26 may perform the discharging process after both determinations have been made. The controller 26 may limit the discharging process after the determination has been made using the voltage (V1) acquired by turning on the fourth switch S4 to shorten a time period necessary for the determination process. In addition, unnecessary switchover of switches can be limited so that it is possible to reduce possible trigger of the failure. It is arbitrary to set an order of turning on the first switch S1 and the fourth switch S4 to perform the determination process.

Figure 14:
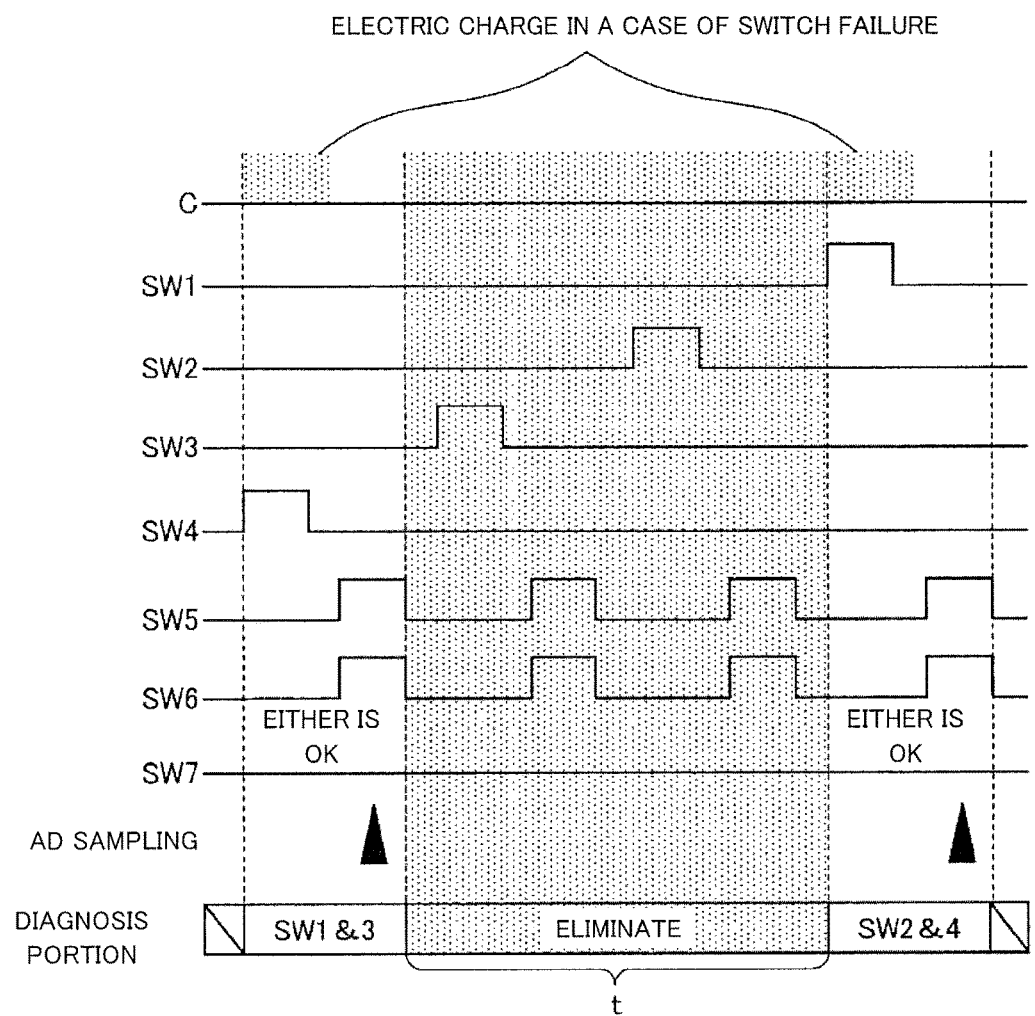
FIG. 14 illustrates a time chart of the state determination process for switches on a high pressure side.

Next, a time chart of the process described above will be explained with reference to FIG. 14. FIG. 14 illustrates the time chart of the state determination process for the switches on the high pressure side.

As shown in FIG. 14, once the fourth switch S4 is turned on, the capacitor C starts to be charged. Subsequently, the fifth switch S5 and the sixth switch S6 are turned on to measure the voltage value at which the capacitor C has been charged. States of the first switch S1 and the third switch S3 are determined based on the measured results.

Next, once the first switch S1 is turned on, the capacitor C starts to be charged. Then, the fifth switch S5 and the sixth switch S6 are turned on to measure the voltage value at which the capacitor C has been charged. States of the second switch S2 and the fourth switch S4 are determined based on the measured results.

As described above, states of the four switches can be determined by turning on and off the switches twice. As compared to a conventional method, this embodiment can eliminate the time periods to turn on and off the second switch S2 and the third switch S3. In other words, it is possible to eliminate a time period t shown in FIG. 14. It does not matter whether the state of the changeover switch S7 is on or off.

<5. Effect>

As described above, the power supply monitoring part 26c detects the stack voltages and the deterioration of the insulation resistors Rp and Rn based on the voltage of the capacitor charged through the first pathway P1/the third pathway P3 or through the fourth pathway P4/the sixth pathway P6. The capacitor changeover part 26a2 switches between the first pathway P1/the third pathway P3 and the fourth pathway P4/the sixth pathway P6.

More specifically, in a case of the first and the third pathways P1 and P3, the power supply monitoring part 26c detects the stack voltages, and in a case of the fourth and sixth pathways P4 and P6, the power supply monitoring part 26c detects deterioration of the insulation resistors Rp and Rn, to monitor the state of the power supply.

Therefore, despite the simple configuration, by controlling only the changeover switch S7, the power supply monitoring apparatus 23 is configured to switch between the charging pathways of which the overall electrostatic capacitances are different from each other and also configured to detect the stack voltages and deterioration of the insulation resistors Rp and Rn accurately.

Moreover, the voltage detection circuit portion 24 of the power supply monitoring apparatus 23 has circuits of which configurations are the same, except the capacitors. Therefore, the power supply monitoring apparatus 23 is configured to detect the stack voltages and deterioration of the insulation resistors Rp and Rn with the simpler configuration.

Further, in the power supply monitoring apparatus 23, since electric current is kept flowing to detect the stack voltages and deterioration of the insulation resistors Rp and Rn, it is possible to receive less noise.

Further, since the power supply monitoring apparatus 23 is configured to determine the state of each switch on the high pressure side without overwrapping time periods in which a pair of the switches are on, it is possible to determine the state of each switch while reducing failures of switch elements and other elements that configure the circuits. Since the power supply monitoring apparatus 23 is configured to determine the state of the four switches by turning on and off two switches, it is possible to shorten a determination time period.

Since the power supply monitoring apparatus 23 is configured to identify a faulty switch element in accordance with a charged electric charge by setting a plurality of threshold values, it is possible to perform an emergency sequence and the like after a fault is detected.

Further, since the power supply monitoring apparatus 23 is configured to determine states of the switches on the high pressure side by use of the plurality of threshold values, if any of the switches is broken, the power supply monitoring apparatus 23 can identify the cell stack to which the faulty switch is connected. Thus, the power supply monitoring apparatus 23 can shorten the time period from a time point at which the failure is identified to a time point at which the failure is handled so that damage can be reduced and the expansion of the damage can be prevented.

Further, since the power supply monitoring apparatus 23 dynamically changes the threshold values based on the voltage of the cell stack, variation of the charging voltage caused by changes in battery voltage can be reduced and accuracy of determining a layer short of a switch element can be improved.

Since the power supply monitoring apparatus 23 is configured to dynamically change each threshold value based on a result of the previous stack voltage detection or a result of the previous deterioration detection for the insulation resistors Rp and Rn, the power supply monitoring apparatus 23 can adjust itself to deterioration of the cell stack and/or circuit features. Thus, since the power supply monitoring apparatus 23 determines a state of the switch on the high pressure side based on a latest state of the circuit, it is possible to realize the high credibility.

The power supply monitoring apparatus 23 identifies the charging pathway to the capacitor C by comparing the voltage value of the capacitor C to a value obtained by multiplying the voltage value of the power supply stack by an integer number so that the power supply monitoring apparatus 23 identifies the faulty switch. Thus, the power supply monitoring apparatus 23 can set a threshold value without a complicated calculation. Therefore, the power supply monitoring apparatus 23 can set an accurate threshold value even in an initial state, and occurrence of a problem caused by an initial defect can be reduced.

The power supply monitoring apparatus 23 is configured to determine a state of each switch on the high pressure side used for the charged state monitoring process and the deterioration detection process by using circuits for the charged state monitoring process and the deterioration detection process. Thus, a special circuit configuration is not necessary and thus it is possible to prevent a size of the circuit from being enlarged.

<6. Modifications>

Next described will be an example of response to a problem that is an ON failure (ON position stuck state) occurring to any of a first switch S1 to a fourth switch S4 on a high pressure side. In a case where one of the switches on the high pressure side has a problem, a power supply monitoring apparatus 23 or an upper ECU, such as a vehicle controller 30, prevents overcharge by estimating a total voltage value of cell stacks while stopping a deterioration detection process for insulation resistors Rp and Rn. In the description below, the upper ECU, such as the vehicle controller 30, and the power supply monitoring apparatus 23 may also be referred to collectively as the power supply monitoring apparatus 23.

For example, in a case where the fourth switch S4 or the third switch S3 has a failure, measurement of a voltage of a first stack 12a is stopped in a power supply monitoring apparatus 23, and in a case where the first switch S1 or the second switch S2 has a failure, measurement of a voltage of a second stack 12b is stopped.

Figure 15:
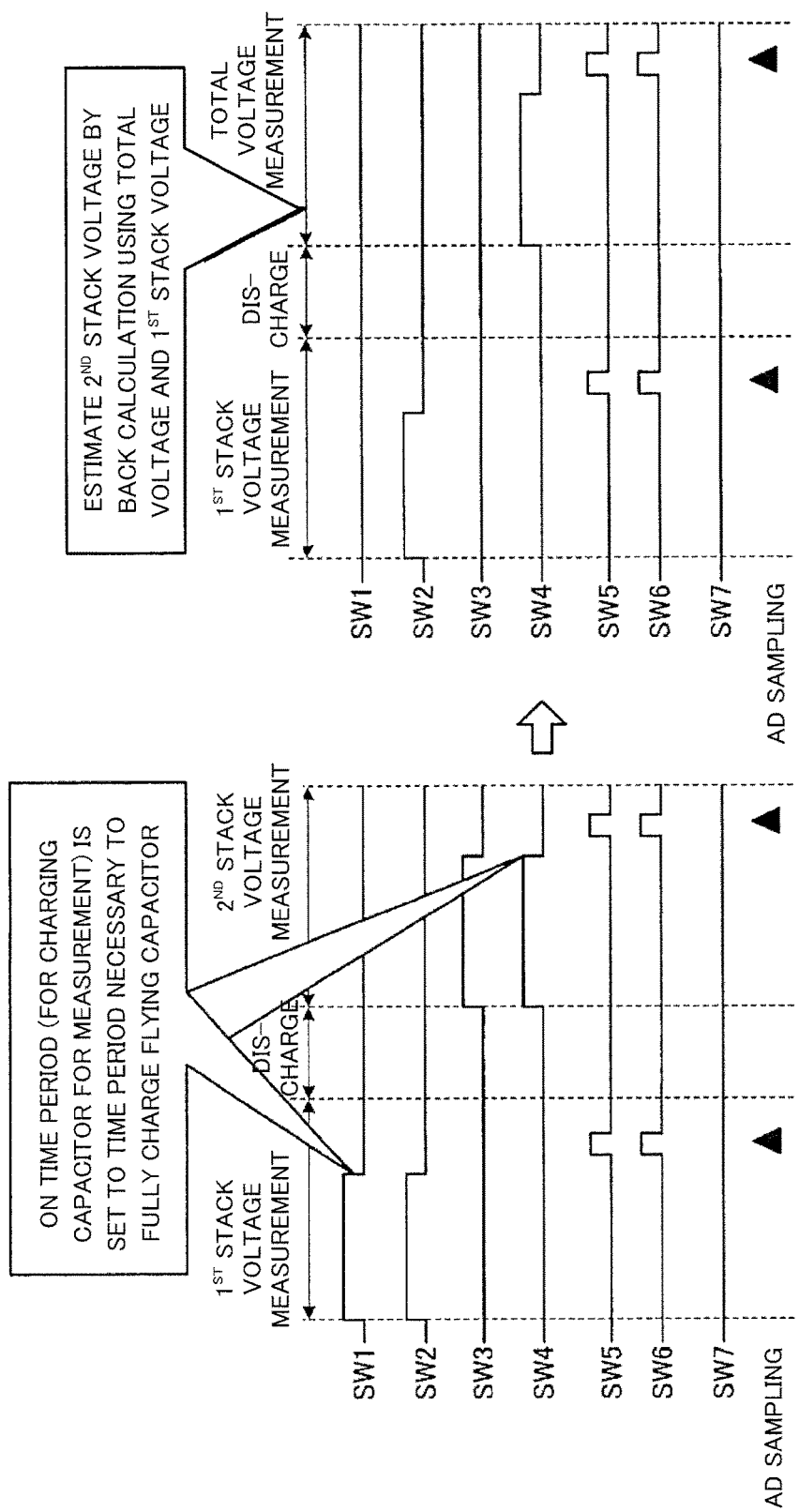
FIG. 15 illustrates a response to a failure occurring to a first switch.
Figure 16:
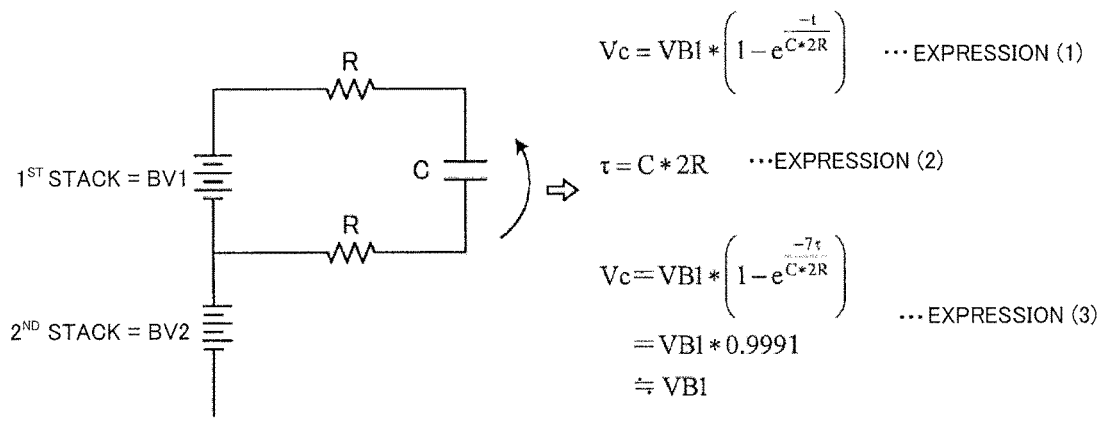
FIG. 16 illustrates measurement of a voltage of the first stack when the first switch has a failure.
Figure 17:
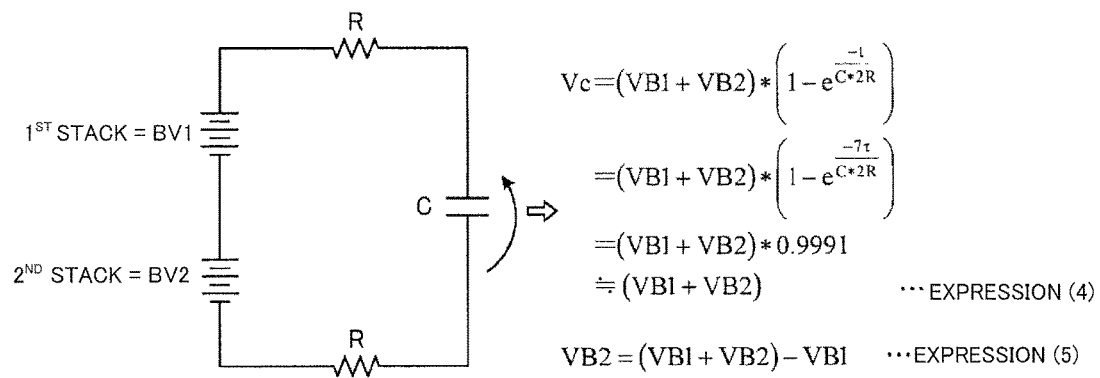
FIG. 17 is a diagram illustrating measurement of the total voltage and estimation of the second stack voltage when the first switch has a failure.

First described will be an example of estimating a second stack voltage when the first switch S1 has a failure, with reference to FIGS. 15 to 17. FIG. 15 illustrates a response to the failure occurring to the first switch S1. As illustrated in a left drawing of FIG. 15, at a normal time, a voltage of the first stack 12a is measured when the first switch S1 is turned on, and when a voltage of the second stack 12b is measured when the fourth switch S4 is turned on.

Thus, the power supply monitoring apparatus 23 sets a time period necessary to fully charge a capacitor C to a time period in which the switch is on. For example, in a case where the first switch S1 has a failure, the power supply monitoring apparatus 23 measures the voltage of the first stack 12a as shown in a right drawing of FIG. 15, and estimates the second stack voltage based on a result of the measurement.

FIG. 16 illustrates measurement of a voltage of the first stack 12a when the first switch S1 has a failure. FIG. 17 illustrates measurement of a total voltage value and estimation of the second stack voltage when the first switch S1 has a failure.

Moreover, FIG. 16 is a simplified diagram illustrating a circuit of the first stack 12a, the first resistor R1, the first switch S1, the fifth resistor R5, the first capacitor C1, the second switch S2 and the second resistor R2 in FIG. 10. FIG. 17 illustrates a simplified diagram of the circuit of the first stack 12a, the first resistor R1, the first switch S1, the fifth resistor R5, the first capacitor C1, the fourth switch S4, the fourth resistor R4 and the second stack 12b in FIG. 10.

Here, a voltage of the first stack 12a is a voltage value VB1; a voltage of the second stack 12b is a voltage value VB2; resistance value is R; and capacitance of a capacitor is C. Moreover, the first switch S1 is used as an example in the description below. However, a similar process can be used for the fourth switch S4.

Where a charging voltage of the capacitor C in FIG. 16 is "Vc," Vc can be expressed by an expression (1), using the voltage value VB1 of the first stack 12a. Here, "t" is a charging time period (charge time). Moreover, a voltage for charging the capacitor C is determined by a time constant "τ". Here, the time constant τ is expressed by an expression (2) using the capacitance "C" of the capacitor and a resistance value "R."

Moreover, where τ is one (1), a charged rate of the capacitor is 63.21%, and where τ is two (2), a charged rate of the capacitor is 86.47% . . . where τ is seven (7), the charged rate of the capacitor is 99.91%. Therefore, it can be seen that in a case of 7τ, the capacitor is almost fully charged. The charged rate may be measured beforehand or a theoretical value may be used for the charged rate.

An expression (3) can be obtained by assigning 7τ to the expression (1). Thus, "Vc" that is charged to the capacitor C is measured as the first stack voltage "VB1."

Then, as shown in FIG. 17, in a case of a charging pathway including both stacks, "Vc" at which the capacitor C is charged can be expressed by an expression (4) using the expressions (1) and (2). In other words, "Vc" is similar to "VB1+VB2." Therefore, considering the expressions (1) to (4), the second stack voltage "VB2," to be estimated, can be estimated by an expression (5).

Figure 18:
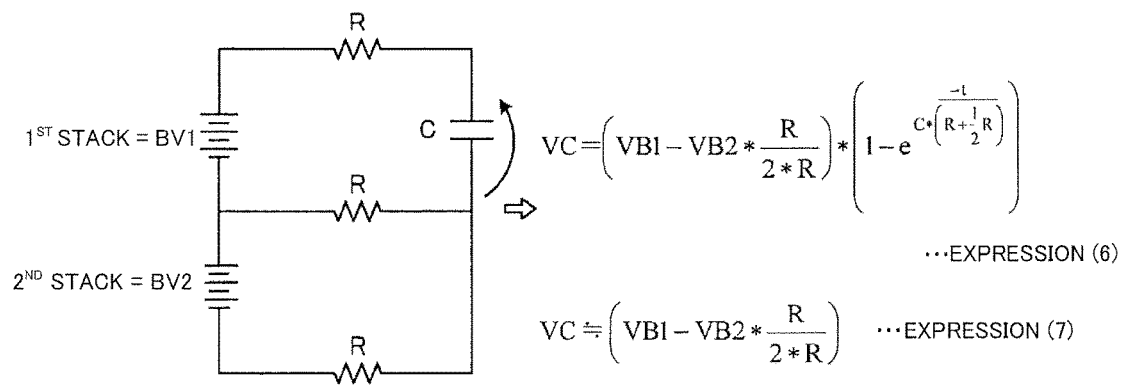
FIG. 18 illustrates a response to a failure occurring to a second switch.

Next described will be an example of estimating the first stack voltage when the second switch S2 has a failure, with reference to FIG. 18. FIG. 18 illustrates a response to the failure occurring to the second switch S2.

Since the first stack voltage "VB1" can be acquired from FIG. 15, in a case where the fourth switch S4 is connected, a pathway illustrated in a left drawing of FIG. 18 is formed. The left drawing of FIG. 18 is a simplified connection diagram for measuring the total voltage value when the second switch S2 and the fourth switch S4 are turned on in FIG. 10. At this time, "Vc" at which the capacitor C is charged can be expressed by an expression (6). Then where a charging time period of the expression (6) is similar to the charging time period of FIG. 15, the expression (6) can be converted to an expression (7). Since the total voltage value and "VB1" are already known, i.e., "VC" and "VB1" are known, in the expression (7), the second stack voltage "VB2" can be estimated by back calculation.

Figure 19:
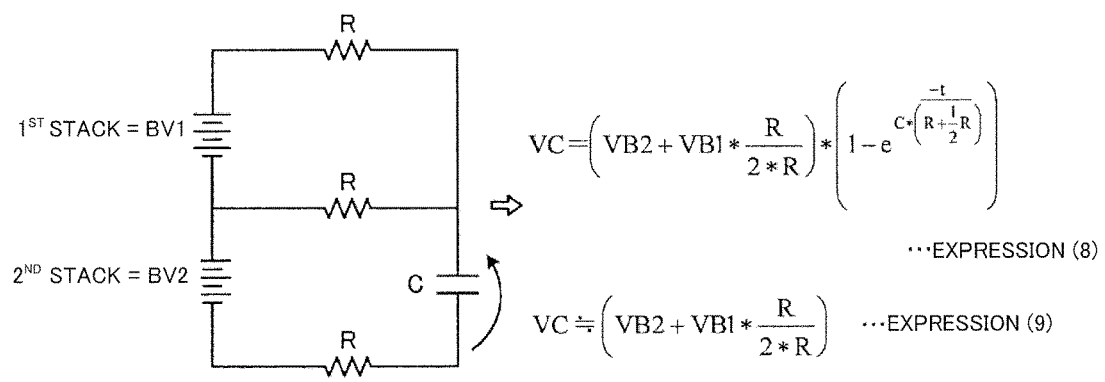
FIG. 19 illustrates a response to a failure occurring to a third switch.

Next described will be an example of estimating the second stack voltage when the third switch S3 has a failure, with reference to FIG. 19. FIG. 19 illustrates a response to the failure occurring to the third switch S3.

Since the first stack voltage "VB1" can be acquired from FIG. 15, in a case where the first switch S1 is connected, a pathway illustrated in a left drawing of FIG. 19 is formed. The left drawing of FIG. 19 is a simplified connection diagram for measuring a total voltage when the third switch S3 and the first switch S1 are turned on in FIG. 10. At this time, "Vc" at which the capacitor C is charged can be expressed by an expression (8). Then, where a charging time period of the expression (8) is similar to the charging time period of FIG. 15, the expression (8) can be converted to an expression (9). Since the total voltage value and "VB2" are already known, i.e., "VC" and "VB2" are known, in the expression (9), the first stack voltage "VB1" can be estimated by back calculation.

As described above, even in a case where the ON position stuck state occurs to any of the first switch S1 to the fourth switch S4, the power supply monitoring apparatus 23 is configured to estimate an unmeasurable stack voltage using a measurable stack voltage and a total voltage value previously acquired so that the power supply monitoring apparatus 23 is configured to continue monitoring the cell stacks using the estimated result although the power supply monitoring apparatus 23 needs to stop the deterioration detection process for the insulation resistors. As described above, even in a case where a switch on the high pressure side has a failure, the power supply monitoring apparatus 23 is configured to monitor overcharge and to prevent expansion of damage because the power supply monitoring apparatus 23 continues monitoring the cell stacks.

In the foregoing embodiment, positions and number of the first capacitor C1, the second capacitor C2, the changeover switch S7, etc. are only examples and are not limited to the description above. In other words, the positions and the like of the first capacitor C1 and the second capacitor C2 may be any position if the total electrostatic capacitance can be changed by a charging pathway to detect a power supply voltage and a charging pathway to detect deterioration of the insulation resistors Rp and Rn.

For example, in the voltage detection circuit portion 24, a switch is newly provided that is connected in series to the first capacitor C1 and also that is connected in parallel to the second capacitor C2 and the changeover switch S7. Then, the new switch and the changeover switch S7 may be controlled to switch between a charging pathway including only the first capacitor C1 and a charging pathway including only the second capacitor C2.

Further, in the voltage detection circuit portion 24, for example, the second capacitor C2 and the changeover switch S7 are connected to the first capacitor C1 in series. Further, a switch connected in parallel to the first capacitor C1 and the changeover switch S7 may be newly provided. Then, the new switch and the changeover switch S7 may be controlled to switch between the charging pathway including the first and second capacitors C1 and C2 that are connected in series to each other and the charging pathway including only the second capacitor C2.

Further, in the foregoing deterioration detection for the insulation resistors Rp and Rn, each of the voltage VRp and the voltage VRn is compared to the threshold value Va. However, the comparison is not limited to that. In other words, for example, the voltage VRp and the voltage VRn may be added. The added voltage may be compared to another threshold value set beforehand to detect deterioration of the insulation resistors Rp and Rn.

A timing of performing the deterioration detection process for the insulation resistors Rp and Rn is not limited to the timing described above. In other words, the timing of performing the deterioration detection process may be changed to, for example, a time point at which a vehicle is started or is stopped, or at a predetermined interval or every predetermined distance of travelling.

While the invention has been shown and described in detail, the foregoing description is in all aspects illustrative and not restrictive. It is therefore understood that numerous other modifications and variations can be devised without departing from the scope of the invention.

What is claimed is:

1. A state determination apparatus comprising:
a plurality of power supplies connected in series;
a first capacitor connected to each of positive and negative electrodes of the plurality of power supplies via a plurality of switch elements;
a second capacitor connected in parallel to the first capacitor via a first switch element; and
a microcomputer connected to the first capacitor and the second capacitor via a second switch element, the microcomputer being configured to determine that one of the plurality of switch elements is stuck in an "ON" position by:
comparing a voltage value of the first capacitor and the second capacitor that is acquired when a first switch element of the plurality of switch elements is turned "ON" to a first threshold value, the first threshold value being based on a voltage value of a first power supply of the plurality of power supplies, the first switch element being connected to one of a total negative-electrode side and a total positive-electrode side of the plurality of power supplies;
upon the voltage value of the first capacitor and the second capacitor being equal to or greater than the first threshold value, comparing the voltage value of the first capacitor and the second capacitor to a second threshold value, the second threshold value being based on a sum of the voltage value of the first power supply and a voltage value of the second power supply of the plurality of power supplies; and
determining which one of the plurality of switch elements is stuck in the "ON" position based on the comparison of the voltage value of the first capacitor and the second capacitor to the second threshold value.

2. The state determination apparatus according to claim 1, wherein the microcomputer determines whether a second switch element is in an "ON" position stuck state in which the second switch element cannot be turned "OFF," by comparing the voltage value of the first capacitor and the second capacitor to a plurality of threshold values, the second switch element being among the plurality of switch elements.

3. The state determination apparatus according to claim 2, wherein each of the plurality of threshold values is set based on a voltage value of one of the plurality of the power supplies or on a total voltage value of the plurality of the power supplies.

4. The state determination apparatus according to claim 3, wherein:
   the first capacitor is used for voltage value detection for the plurality of the power supplies,
   the second capacitor is used for deterioration detection for an insulation resistor of the plurality of power supplies, and
   the microcomputer updates the plurality of threshold values using a detection result of the voltage value detection or a detection result of the deterioration detection for the insulation resistor.

5. The state determination apparatus according to claim 1, wherein, in response to a first voltage value of the first capacitor and a second voltage value of the second capacitor being continuously acquired, the microcomputer acquires one of the first and second voltage values and then acquires the other voltage value without performing a discharging process, the first voltage value being acquired when the first switch element connected to the total negative-electrode side is turned "ON," and the second voltage value being acquired when the first switch element connected to the total positive-electrode side is turned "ON".

6. The state determination apparatus according to claim 1, wherein the microcomputer identifies a charging pathway to the first capacitor and the second capacitor by comparing the voltage value of the first capacitor and the second capacitor to a value obtained by multiplying a voltage value of one of the plurality of power supplies by an integer number and then determines whether a second switch element is in an "ON" position stuck state in which the second switch element cannot be turned off, the second switch element being among the plurality of switch elements.

7. The state determination apparatus according to claim 1, further comprising a plurality of cell stacks, each cell stack including a corresponding set of power supplies of the plurality of power supplies that are connected in series, wherein the first capacitor and the second capacitor are connected in parallel with each cell stack of the plurality of cell stacks.

8. A state determination method applied to a state determination apparatus having a plurality of power supplies connected in series, a first capacitor connected to each of positive and negative electrodes of the plurality of power supplies via a plurality of switch elements, and a second capacitor connected in parallel to the first capacitor via a first switch element, the method comprising the steps of:
   (a) comparing, by a microcomputer connected to the first capacitor and the second capacitor via a second switch element, a voltage value of each of the first capacitor and the second capacitor that is acquired when a first switch element of the plurality of switch elements is turned "ON," the first threshold value being based on a voltage value of a first power supply of the plurality of power supplies, the first switch element being connected to one of a total negative-electrode side and a total positive-electrode side of the plurality of power supplies;
   (b) upon the voltage value of the first capacitor and second capacitor being equal to or greater than the first threshold value, comparing the voltage value of the first capacitor and the second capacitor to a second threshold value, the second threshold value being based on a sum of the voltage value of the first power supply and a voltage value of the second power supply of the plurality of power supplies; and
   (c) determining whether one of the plurality of switch elements is stuck in an "ON" position based on the comparison of the voltage value of the first capacitor and the second capacitor to the second threshold value.

9. The state determination method according to claim 8, wherein the step (c) determines whether a second switch element is in an "ON" position stuck state in which the second switch element cannot be turned "OFF," by comparing the voltage value of the first capacitor and the second capacitor to a plurality of threshold values, the second switch element being among the plurality of switch elements.

10. The state determination method according to claim 9, wherein each of the plurality of threshold values is set based on a voltage value of one of the plurality of the power supplies or on a total voltage value of the plurality of the power supplies.

11. The state determination method according to claim 10, wherein:
   the first capacitor is used for voltage value detection of the plurality of the power supplies,
   the second capacitor used for deterioration detection for an insulation resistor of the plurality of power supplies, and
   the state determination method further comprises the step of (d) updating the plurality of threshold values using a detection result of the voltage value detection or a detection result of the deterioration detection for the insulation resistor.

12. The state determination method according to claim 8, wherein when continuously acquiring a first voltage value and a second voltage value of the first capacitor and the second capacitor, the step (a) acquires one of the first and second voltage values and then acquires the other voltage value without performing a discharging process, the first voltage value being acquired when the first switch element connected to the total negative-electrode side is turned "ON," and the second voltage value being acquired when the first switch element connected to the total positive-electrode side is turned "ON".

13. The state determination method according to claim 8, wherein the step (c) identifies a charging pathway to the capacitor by comparing the voltage value of the first capacitor and the second capacitor to a value obtained by multiplying a voltage value of one of the plurality of power supplies by an integer number and then determines whether a second switch element is in an "ON" position stuck state in which the second switch element cannot be turned "OFF," the second switch element being among the plurality of switch elements.

* * * * *